United States Patent
Bell et al.

(10) Patent No.: US 11,421,919 B2
(45) Date of Patent: Aug. 23, 2022

(54) THERMOELECTRIC SYSTEMS EMPLOYING DISTRIBUTED TRANSPORT PROPERTIES TO INCREASE COOLING AND HEATING PERFORMANCE

(71) Applicant: DTP Thermoelectrics LLC, Altadena, CA (US)

(72) Inventors: Lon Bell, Altadena, CA (US); Douglas Crane, El Cerrito, CA (US)

(73) Assignee: DTP Thermoelectrics LLC, Altadena, CA (US)

( * ) Notice: Subject to any disclaimer, the term of this patent is extended or adjusted under 35 U.S.C. 154(b) by 0 days.

(21) Appl. No.: 17/347,275

(22) Filed: Jun. 14, 2021

(65) Prior Publication Data
US 2021/0302075 A1    Sep. 30, 2021

Related U.S. Application Data

(63) Continuation-in-part of application No. PCT/US2020/016247, filed on Jan. 31, 2020.
(Continued)

(51) Int. Cl.
*F25B 21/04* (2006.01)
*H01L 35/32* (2006.01)

(52) U.S. Cl.
CPC .............. *F25B 21/04* (2013.01); *H01L 35/32* (2013.01)

(58) Field of Classification Search
CPC .......... H01L 23/38; H01L 35/30; H01L 35/32
See application file for complete search history.

(56) References Cited

U.S. PATENT DOCUMENTS 3,212,274 A    10/1965 Eidus
3,564,860 A    2/1971 Reich et al.
(Continued)

FOREIGN PATENT DOCUMENTS

EP    1669697 A1    6/2006
JP    2018192968    12/2018
(Continued)

OTHER PUBLICATIONS

Anatychuk, et al., "Functionally Graded Materials and New Prospects for Thermoelectricity Use," 16th International Conference on Thermoelectrics 588-591 (1997).
(Continued)

*Primary Examiner* — Filip Zec
(74) *Attorney, Agent, or Firm* — Snell & Wilmer L.L.P.; Jaime D. Choi

(57) ABSTRACT

Thermoelectric systems employing distributed transport properties to increase cooling and heating performance are provided herein. In some examples, a thermoelectric heat pump is provided that includes a distributed transport properties (DTP) thermoelectric (TE) couple including at least one DTP TE element. The at least one DTP TE element includes a TE material with a Seebeck coefficient, thermal conductivity, or electrical resistance varying within said DTP TE element such that when that DTP TE element is subjected to a fixed temperature differential and no current is flowing in a primary direction that produces heat pumping action, at least at one position within that DTP TE element there is a current that in steady state operation produces a lower temperature than the temperature at that position when no current is flowing.

37 Claims, 15 Drawing Sheets

Related U.S. Application Data

(60) Provisional application No. 63/115,277, filed on Nov. 18, 2020, provisional application No. 63/039,107, filed on Jun. 15, 2020, provisional application No. 62/800,346, filed on Feb. 1, 2019.

(56) References Cited

U.S. PATENT DOCUMENTS

| | | | |
|---|---|---|---|
| 5,361,587 A | 11/1994 | Hoffman | |
| 6,672,076 B2 | 1/2004 | Bell | |
| 7,752,852 B2 | 7/2010 | Akei et al. | |
| 8,307,663 B2 | 11/2012 | Akei et al. | |
| 9,178,128 B2* | 11/2015 | Jovovic | H01L 35/28 |
| 9,865,788 B2* | 1/2018 | Laemmle | H01L 35/10 |
| 2004/0042181 A1 | 3/2004 | Nagasaki | |
| 2007/0101750 A1 | 5/2007 | Pham et al. | |
| 2009/0007952 A1 | 1/2009 | Kondoh et al. | |
| 2011/0036384 A1* | 2/2011 | Culp | H01L 35/32 |
| | | | 136/201 |
| 2011/0120517 A1 | 5/2011 | Li | |
| 2012/0139075 A1* | 6/2012 | Shankar | H01L 27/16 |
| | | | 257/467 |
| 2013/0000688 A1* | 1/2013 | Cho | H01L 35/32 |
| | | | 136/200 |
| 2013/0074898 A1 | 3/2013 | Snyder | |
| 2013/0327063 A1 | 12/2013 | Gawthrop | |
| 2017/0284708 A1 | 10/2017 | Wang et al. | |
| 2019/0077225 A1 | 3/2019 | Nakamura et al. | |

FOREIGN PATENT DOCUMENTS

| | | |
|---|---|---|
| KR | 100298724 | 11/2001 |
| WO | WO 2007/027171 A1 | 3/2007 |

OTHER PUBLICATIONS

Angrist, "Direct Energy Conversion," Thermoelectric Generators Chapter 4 139-144 (1965).
Astrain, et al., "Improvements in the cooling capacity and the COP of a transcritical $CO_2$ refrigeration plant operating with a thermoelectric subcooling system," Applied Thermal Engineering, 155: 110-122 (2019).
Bell, Lon E., "Optimally Distributed Transport Properties can Produce Highest Performance Thermoelectric Systems," Phys. Status Solidi A, 1900562: 1-7 (2019) https://doi.org/10.1002/pssa.201900562.
Bhattacharjee, et al., "A shield based thermoelectric converter system with a thermosyphonic heat sink for utilization in woodstoves." ICAER, (2015).
Bian, et al., "Beating the maximum cooling limit with graded thermoelectric materials." Appl. Phys. Lett. 89, 212101 (2006) https://doi.org/10.1063/1.2396895.
Buist, R.J. "The Extrinsic Thomson Effect." Proceedings of the 14th International Conference on Thermoelectrics, St. Petersburg 1-4 (1995).
Chung et al., "$CsBi_4Te_6$: A high-performance thermoelectric material for low-temperature applications," Science 287: 1024-1027 (2000) DOI: 10.1126/science.287.5455.1024.
Crane, et al., "Maximum temperature difference in a single-stage thermoelectric device through distributed transport properties," International Journal of Thermal Sciences 154: 1-9 (2020) https://doi.org/10.1016/j.ijthermalsci.2020.106404.
Goldsmid, "The physics of thermoelectric energy conversion" (Morgan & Claypool, 2017) DOI 10 .1088/978-1-6817-4641-8.
International Search Report and Written Opinion of the International Searching Authority dated Apr. 29, 2020 in Int'l PCT Patent Appl. Serial No. PCT/US2020/016247.
Jamali, et al., "Performance improvement of a transcritical $CO_2$ refrigeration cycle using two-stage thermoelectric modules in subcooler and gas cooler," International Journal of Refrigeration, 74: 105-115 (2017) http://dx.doi.org/10.1016/j.ijrefrig.2016.10.007.
Kaliazin et al., "Rigorous calculations related to functionally graded and segmented thermoelectrics," International Conference on Thermoelectrics (2001).
Korshuev, et al., "Efficiency of Low-Grade Heat Recovery Using Various Thermoelectric Converters." Journal of Thermoelectricity, ISSN 16070-8829, 1: 63-70 (2011).
Kuznetsov, "Functionally graded materials for thermoelectric applications," Thermoelectrics Handbook—Macro to Nano (D.M. Rowe, editor, CRC Tatlor & Francis, 2006).
Kwan, et al., "Application of the Peltier sub-cooled trans-critical carbon dioxide heat pump system for water heating—Modelling and performance analysis," Energy Conversion and Management, 185: 574-585 (2019) https://doi.org/10.1016/j.enconman.2019.01.104.
Lee et al., "Nanoporous Si as an Efficient Thermoelectric Material," Nano Letters 8(11): 3750-3754 (2008).
Llopis, et al., "Subcooling methods for $CO_2$ refrigeration cycles: A review," International Journal of Refrigeration, 93: 85-107 (2018) https://doi.org/10.1016/j.ijrefrig.2018.06.010.
Müller, et al., "Optimization Strategies for Segmented Peltier Coolers," Physica Status Solidi (a) 203(8): 2128-2141 (2006) DOI 10.1002/pssa.200521047.
Nakamura, "First-principles simulation on Seebeck coefficient in silicon and silicon carbide nanosheets," Japanese Journal of Applied Physics Part 1 55: 06GJ07 (2016).
Nolas et al., "Thermoelectrics—Basic principles and new materials developments" (Springer-Verlag, Berlin Heidelberg, 2001).
Ren, et al., "Thermal conductivity anisotropy in holey silicon nanostructures and its impact on thermoelectric cooling," Nanotechnology 29: 045404 (8pp) (2018) https://doi.org/10.1088/1361-6528/aa9f07.
Rull-Bravo, et al., "Skutterudites as Thermoelectric Materials: Revisted." RSC Advances 5: 41653-41667 (2015).
Sarkar, "Performance optimization of transcritical $CO_2$ refrigeration cycle with thermoelectric subcooler," Int. J. Energy Res, 37:121-128 (2013) https://onlinelibrary.wiley.com/doi/abs/10.1002/er.1879.
Schoenfeld, et al., "Experimental Results: Thermoelectric 'Subcooler' for $CO_2$ Transcritical Vapor Compression System," International Institute of Refrigeration, record ID: 2010-1890: 1-26 (2009).
Schoenfield, et al., "$CO_2$ transcritical vapor compression cycle with thermoelectric subcooler," HVAC&R Research, 18(3): 297-311 (2012) https://doi.org/10.1080/10789669.2012.625348.
Schierning, "Silicon nanostructures for thermoelectric devices: A review of the current state of the art," Phys. Status Solidi A 211(6): 1235-1249 (2014) DOI:10.1002/pssa.201300408.
Semeniouk et al., "Single stage thermoelectric coolers with temperature difference of 80K," International Conference on Thermoelectrics (St. Petersburg, Russia, 1995).
Shao, et al., "Thermodynamic transition from subcritical to transcritical $CO_2$ cycle," International Journal of Refrigeration, 64: 123-129 (2016) http://dx.doi.org/10.1016/j.ijrefrig.2016.01.018.
Snyder et al. "Supercooling of Peltier cooler using a current pulse," Journal of Applied Physics 92:1564-1569 (2002) http://dx.doi.org/10.1063/1.1489713.
Snyder, et al., "Improved thermoelectric cooling based on the Thomson effect." American Physical Society, Physical Review B 86, 045202-1-8 (2012) DOI: 10.1103/PhysRevB.86.045202.
Stranz et al., "Thermoelectric Properties of a High-Doped Silicon from Room Temperature to 900K," Journal of Electronic Materials 42(7): 2381-2387 (2013) DOI: 10.1007/s11664-013-2508-0.
Tang et al., Holey silicon as an efficient thermoelectric material, Nanoletters 10: 4279-4283 (2010).
Tritt, et al., "Thermoelectric materials, phenomena, and applications: A bird's eye view" MRS Bulletin 31:188-229 (2006).
Vikhor, et al., "Theoretical evaluation of maximum temperature difference in segmented thermoelectric coolers," Applied Thermal Engineering 26: 1692-1696 (2006) https://doi.org/10.1016/j.applthermaleng.2005.11.009.
Walczak, et al., "Modeling of Segmented Peltier Cooling with Discrete and Continuous Concentration Function." Trans Tech Publications, Switzerland Materials Science Forum 492-493: 507-516 (2005) doi: 10.4028/www.scientific.net/MSF.

(56) References Cited

OTHER PUBLICATIONS

Wang, et al., "Exact Solution of a Constrained Optimization Problem in Thermoelectric Cooling," Applied Mathematical Sciences, 2(4): 177-186 (2008).

Wang, et al., "Experimental and numerical investigation of a $CO_2$ heat pump system for electrical vehicle with series gas cooler configuration," International Journal of Refrigeration, 100: 156-166 (2019) https://doi.org/10.1016/j.ijrefrig.2018.11.001.

Wantha, "Experimental investigation of the influence of thermoelectric subcooler on the performance of R134a refrigeration systems," Applied Thermal Engineering, 80: 1-8 (2020) https://doi.org/10.1016/j.applthermaleng.2020.115829.

Winkler, et al., "Potential Benefits of Thermoelectric Element Used With Air-Cooled Heat Exchangers," Purdue University Purdue e-Pubs, International Refrigeration and Air Conditioning Conference. Paper 813, -9 (2006) http://docs.lib.purdue.edu/iracc/813.

Yamashita, et al., "Dependence of Seebeck Coefficient on Carrier Concentration in Heavily B- and P-Doped $Si_{1-x}Ge_x$ ($x \leq 0.05$) System" Japanese Journal of Applied Physics 38(11):6394-6400 (1999).

Yazawa, et al., "Cost Optimization of Thermoelectric Sub-Cooling in Air-cooled $CO_2$ Air Conditioners," International Refrigeration and Air Conditioning Conference, Paper 1626 1-10 (2016) http://docs.lib.purdue.edu/iracc/1626.

Zhou et al., "Pulsed cooling of inhomogeneous thermoelectric materials," Journal of Physics D: Applied Physics 40:4376-4381 (2007).

Zhu, et al., "Theoretical study of a thermoelectric-assisted vapor compression cycle for air-source heat pump applications," International Journal of Refrigeration 51: 33-40 (2015) http://dx.doi.org/10.1016/j.ijrefrig.2014.12.001.

Ziabari, "Nanoscale solid-state cooling: A review," Reports on Progress in Physics 79(095901):34 (2016) doi: 10.1088/0034-4885/79/9/095901.

International Search Report and Written Opinion of the International Searching Authority dated Sep. 17, 2021 in Int'l PCT Patent Appl. Serial No. PCT/US2021/037249 (13 pages).

International Search Report and Written Opinion of the International Searching Authority dated Oct. 7, 2021 in Int'l PCT Patent Appl. Serial No. PCT/US2021/037253 (8 pages).

Kishore, et al., "Ultra-high performance wearable thermoelectric coolers with less materials," Nature Communications; 10:1: pp. 1-13 (2019).

Non-Final Office Action dated Feb. 7, 2022 in U.S. Appl. No. 17/385,241; total 28 pages.

Final Office Action dated May 25, 2022, in U.S. Appl. No. 17/385,241 (39 pages).

\* cited by examiner

THERMOELECTRIC SYSTEMS EMPLOYING DISTRIBUTED TRANSPORT PROPERTIES TO INCREASE COOLING AND HEATING PERFORMANCE

CROSS REFERENCE TO RELATED APPLICATIONS

This application claims the benefit of the following applications, the entire contents of each of which are incorporated by reference:

U.S. Provisional Patent Application No. 63/039,107, filed on Jun. 15, 2020 and entitled "Increased Heat Pumping Capacity and Maximum Power Output from Using DTP Thermoelectrics;" and U.S. Provisional Patent Application No. 63/115,277, filed on Nov. 18, 2020 and entitled "Temperature Control Using DTP Thermoelectrics."

This application is a continuation-in-part of International Patent Application No. PCT/US2020/016247, filed on Jan. 31, 2020 and entitled "Thermoelectric Elements and Devices with Enhanced Maximum Temperature Differences Based on Spatially Varying Distributed Transport Properties," which claims the benefit of U.S. Provisional Patent Application No. 62/800,346, filed on Feb. 1, 2019 and entitled "Optimally Distributed Transport Properties Combined with Variable Leg Area for Highest Performance Thermoelectric Device," the entire contents of each of which are incorporated by reference herein.

FIELD

This application relates to thermoelectric elements and devices with distributed transport properties.

BACKGROUND

A thermoelectric (TE) material at the same temperature throughout with distributed transport properties (DTP) has varying properties (Seebeck coefficient, electrical resistivity, and thermal conductivity) at different spatial locations within the material. The concept has also been described as functionally graded material. First described as a material utilizing the distributed Peltier effect by Reich et al.'s patent application, filed in 1966 and issued as U.S. Pat. No. 3,564,860 in 1971, claimed a material "having differing thermoelectric properties along the spatial extent thereof between said hot junction and said cold junction" and further states that the absolute value of the Seebeck coefficient at the cold junction is "significantly less than the absolute value of the Seebeck coefficient of material at said hot junction." Thus emphasis was placed on Seebeck variation, with any changes in the other two transport properties left uncontrolled.

Buist described an approach as the extrinsic Thomson effect in "The Extrinsic Thomson Effect (ETE)," International Conference on Thermoelectrics (Cardiff, Wales, 1991). In this paper, he describes test results for a three-stage device with up to 20% gain in maximum temperature difference. The group of Walczak, Seifert, and Muller conducted modelling studies achieving a maximum temperature difference of 10-20% using what they called the functionally graded material (FGM) effect as described in "Modeling of segmented Peltier cooling with discrete and continuous concentration function," Materials Science Forum 492-493: 507-516 (2005) and "Optimization strategies for segmented Peltier coolers," Physica Status Solidi (a) 203(8): 2128-2141 (2006). They claimed that no substantial improvement can be achieved with greater than five stages. Korzhuev and Nikhesina also described the effect that creates improvement by " . . . 20% and more" in "Efficiency of low-grade heat recovery using various thermoelectric converters," Journal of Thermoelectricity No. 1, 4: 63-70 (2011). Kaliazin et al. studied FGM stating that "real coefficient of performance can indeed be significantly different from that given by Ioffe formula, particularly in the regime of maximum temperature" in "Rigorous calculations related to functionally graded and segmented thermoelectrics," International Conference on Thermoelectrics (2001). Semeniouk et al. described fabrication of a device with distributed properties in two segments by the Czochralski method, achieving a maximum temperature difference of 83 C for a single stage device in "Single stage thermoelectric coolers with temperature difference of 80 C," International Conference on Thermoelectrics (St. Petersburg, Russia, 1995). Bian and Shakouri described that "cooling enhancement is attributed to the redistribution of the Joule heating and Peltier cooling profiles" in "Beating the maximum cooling limit with graded thermoelectric materials," Applied Physics Letters 89: 212101-1 to -3 (2006). They concluded that "more than twice maximum cooling temperature of the uniform material with the same ZT can be achieved". All the preceding studies emphasize maximum temperature differential without teaching the relationship among transport properties to achieve maximum benefit.

Anatychuk and Vikhor described different methods to produce functionally graded materials, including by pressing, extrusion, zone melting, and the Czochralski method in "Functionally graded materials and new prospects for thermoelectricity use," International Conference on Thermoelectrics (1997). Kuznetsov further described making functionally graded materials using the Bridgeman method, Czochralski technique, plasma spray method, diffusion of a dopant from a gaseous phase, zone leveling technique, and hot pressing of powder layers containing different amounts of a dopant in "Functionally graded materials for thermoelectric applications," Thermoelectrics Handbook—Macro to Nano (D. M. Rowe, editor, CRC Tatlor & Francis, 2006). He further concluded that the efficiency of a functionally graded material is insensitive to variations in the doping profile "which means that the carrier concentration along the length of the material does not have to match exactly the optimum profile to achieve thermoelectric efficiency very close to its maximum possible value".

In the aforementioned prior art, the selection and methods to functionally grade materials or distributed transport properties are not described by the limited number of researchers as methods to control cooling or heating capacity, and strategies for increasing cooling and or heating capacity are not discussed.

SUMMARY

The broad societal need to reduce energy consumption results in growing applications for higher efficiency and greater thermal capacity solid-state cooling and heating systems. Specific opportunities exist to create electrically powered solid-state systems for vehicle (e.g., electric vehicle) heating, ventilation and air conditioning (HVAC), residential heat pumps for homes, and compact, high power density thermal management systems for the electronics industry. The improvements in cooling and heating thermal management performance achievable from appropriately designing and producing DTP TE material systems are advantageous for satisfying these demands.

Production TE heating and cooling systems use n-type and p-type TE materials that are each of a single composition. The p- and n-materials have been developed over the past 20 to 50 years to attempt to maximize TE device performance. Despite the efforts of researcher initiatives in America, Asia and Europe, TE system performance for many potential applications is still not adequate. The present disclosure is based on newly developed equations, and optimized solutions to equations, that accurately describe the key performance metrics which govern TE device operation. The solutions to these equations lead to new design concepts that measurably improve TE device performance. For example, the solutions to these equations may be used to guide the TE material properties selection process, and to produce TE devices with increased efficiency and higher heat pumping capacity. These new solutions show that composite materials, with properly selected transport properties (Seebeck coefficient, thermal conductivity and electrical conductivity) which vary in a prescribed manner in a TE n- and p-couple in the primary direction of current flow, can improve the key metrics of operating efficiency and TE device heat pumping capacity.

TE elements and devices are discussed in terms of the new design criteria that improves the performance of DTP TE devices over that of conventional thermoelectric (CTE) devices. New computer models are referenced for computing performance of DTP TE system couples. It is shown that by appropriately combining traditional CTE materials into segmented composite TE elements with DTP, device performance can be improved. Examples are given for a non-limiting, representative sample of such combinations, and the resulting performance is modeled. These results show the gains in maximum temperature differential (Max DT), energy conversion efficiency (coefficient of performance, or COP), and increased heat pumping capacity (cooling capacity $Q_C$ and heating capacity $Q_H$, respectively) result from various new methods of implementing DTP couple design.

The gains in Max DT and $Q_C$ provide or enable the design of TE cascade systems, utilizing DTP, that exhibit increased Max DT with higher $Q_C$ for the same number of cascade stages. As a result, to achieve performance of present CTE cascades, it is shown that with the new designs using DTP, fewer stages may be required and $Q_C$ and COP may increase as compared to CTE cascades. Indeed, gains from DTP are shown to be useful in making cascade systems with performance that exceeds that of CTE cascades by an amount that enables new applications for TE coolers and thermal management systems.

The differences in performance and the gain made possible through the new DTP designs are identified. The beneficial performance increases from DTP design, combined with recently available fabrication technologies, are shown to be capable of producing significant realizable increases in TE device performance. Several modern production methods which allow manufacture of such composite material systems are described.

DETAILED DESCRIPTION

Figure 1:
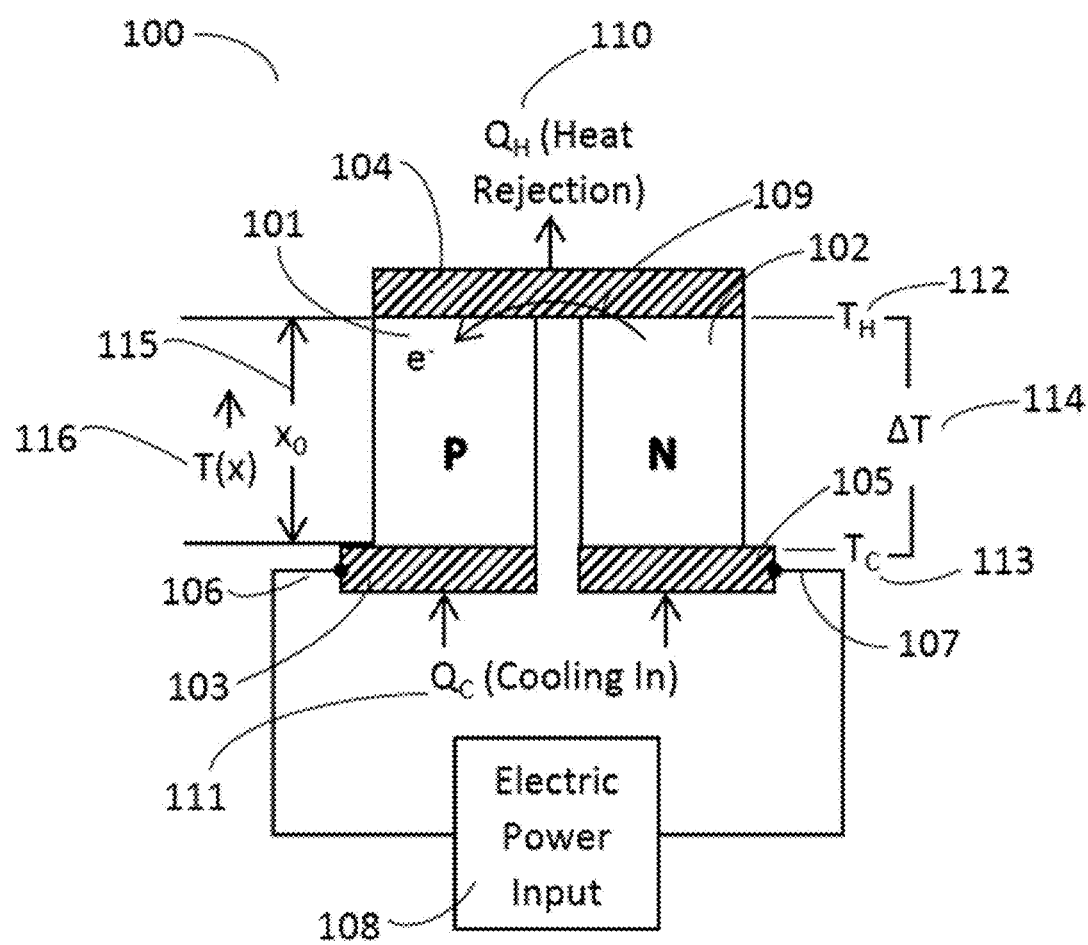
FIG. 1 schematically illustrates an example TE couple.

As provided herein, to design more efficient and higher capacity TE systems, it is most advantageous to develop a more comprehensive description of the processes and properties that affect TE device performance than previously available. As background, FIG. 1 schematically illustrates an example CTE couple 100 including a p-type element 101, and n-type element 102, cold side electrodes 103 and hot side electrode 104. A power supply 108 connected to cold side electrodes 103 at position 106 and position 107 produces an electron flow 109 in the direction indicated when voltage is applied. The elements each have a length $x_0$ 115. When TE system 100 is in operation, the hot side is at temperature $T_H$ 112 and the cold side at a temperature $T_C$ 113, at a temperature differential DT 114, produce temperature profile $T(x)$ 116 within the legs 101 and 102 and extract thermal power $Q_C$ 111 at the cold side and reject heat $Q_H$ 110 at the hot side.

TE system 100 is the basic model used herein to describe CTE and DTP TE systems.

To address factors affecting performance that extend beyond the design and computational models that are used in traditional CTE TE system design, newly developed comprehensive basic equations that govern DPT TE system design are provided herein. Solutions to these equations are employed to develop the design of new DTP TE devices with improved performance. Throughout the discussion that follows, the performance of the new DTP TE systems is compared to that of the CTE designs taught in the literature and in commercial product application notes.

The present DTP thermoelectric system designs are based on new material design considerations that are believed to be fundamentally different than those produced using CTE material system designs.

The underpinnings of TE device performance improvements may be best understood by considering the fundamental one-dimensional transport equation that governs performance of a thermoelectric device:

$$\frac{d}{dx}\left[\lambda(x)\frac{dT(x)}{dx}\right] - T(x)j(x)\frac{dS(x)}{dx} = -j(x)^2\rho(x). \quad (1)$$

Figure 2:
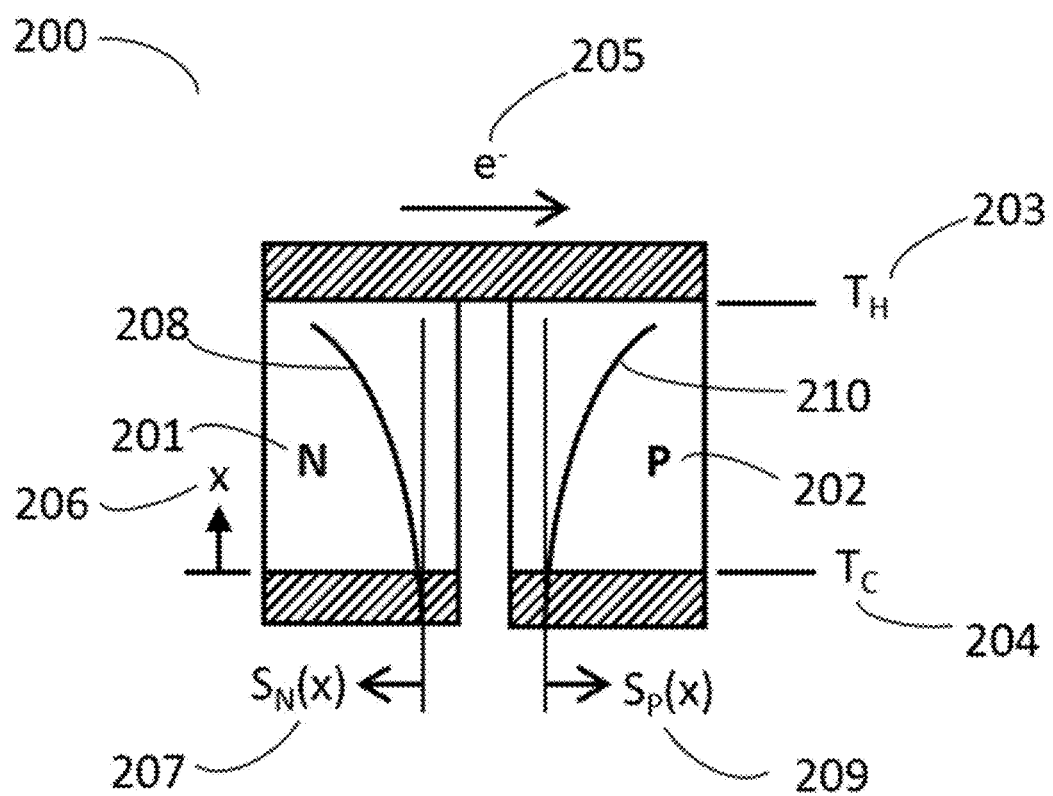
FIG. 2 schematically illustrates an example magnitude of the Seebeck coefficient as a function of distance in the direction of current flow for an example DTP TE element.

In equation 1, x is the primary direction of current flow (as distinguished from other, e.g., diffusive, directions of current flow), $\lambda(x)$ is the TE material thermal conductivity which can vary with position x, $T(x)$ is the temperature in the TE element as a function of x, $j(x)$ is the current density, $S(x)$ is the Seebeck coefficient as a function of x, and $\rho(x)$ is the electrical resistance as a function of x. FIG. 2 schematically illustrates an example DTP TE couple 200 including TE elements 201 and 202, a hot side $T_H$ 203, a cold side $T_C$ 204 and electron flow 205. Position x 206 is the distance from the cold side $T_C$ 204. In this example, for explanatory purposes, both the n-type TE element 201 and the p-type element 202 are assumed to be of equal length and constant width and thickness. Here, and in the remainder of this analysis (unless stated otherwise), properties vary only with x. For nonlimiting example configurations for DTP TE couple 200, see International Patent Application No. PCT/US2020/016247, filed on Jan. 31, 2020 and entitled "Thermoelectric Elements and Devices with Enhanced Maximum Temperature Differences Based on Spatially Varying Distributed Transport Properties," the entire contents of which are incorporated by reference herein.

In CTE TE systems, the same TE material is used throughout each TE element length. Thus, the Thompson term, $$T(x)j(x)\frac{dS(x)}{dx}$$

in Equation (1) becomes zero since S, the Seebeck coefficient for the same material, is constant and does not change with position x. Since uniform properties are assumed in nearly all current textbooks and supplier literature that cover TE device design, in presentations where TE equations are derived, the Thompson term does not appear in the initial equation. See, for example Angrist, Direct Energy Conversion, 4th ed., Boston: Allyn and Bacon, Inc. (1982), the entire contents of which are incorporated by reference herein. The resulting simpler expressions for COP, Max DT, temperature profile and other derived expressions used herein are called CTE solutions.

In the DTP governing equations provided herein, the Thompson term is retained, and transport properties are changed in the primary direction of current flow x in accordance with advantageous design rules that result from the more comprehensive DTP formulation. These newly presented equations form the basis for a more complete and useful set of solutions to Equation (1), and the solutions to these equations provide for and enable designs that increase device performance.

If the terms in equation (1) are rearranged, when current flows, the Thompson term and the Joule heating term are seen to partially offset each other:

$$\frac{d}{dx}\left[\lambda(x)\frac{dT(x)}{dx}\right] - T(x)j(x)\frac{dS(x)}{dx} + j(x)^2\rho(x) = 0. \quad (2)$$

The Thompson term is a linear function of current density, j, while the Joule heating term contains current density squared ($j(x)^2\rho(x)$), so it may be understood that these terms completely offset one another at each location, x, at zero current density and at a non-zero value of current density. The terms will partially offset each other at all other current densities.

As provided herein, the Thompson term magnitude may be chosen (subject to physical material limitations) to offset the Joule heating term, and/or to optimize COP, and/or to optimize any other desired operating metric or combination of desired operating metrics. Subject to constant ZT throughout the TE element, where ZT refers to the thermoelectric figure of merit ($ZT=S^2/(\lambda\rho)$), the optimum performance may be achieved in DTP systems when, at optimum TE efficiency, the temperature profile within the TE element is:

$$T(x) = T_C\left(\frac{T_H}{T_C}\right)^{\frac{x}{x_0}} = T_C e^{D\frac{x}{x_0}} \quad (3)$$

where $T_C$ is the cold end temperature, $T_H$ is the hot end temperature, $x_0$ is the TE element length, and $$D = \ln\left(\frac{T_H}{T_C}\right)$$

and the transport properties. $S(x)$, $\lambda(x)$, and $\rho(x)$ continuously vary with position along the element length in the following fashion:

$$S(\varepsilon, x) = S_C e^{A(\varepsilon)\frac{x}{x_0}} \quad \text{where} \quad A(\varepsilon) = \frac{ZT\varepsilon^2 + \ln^2\left(\frac{T_H}{T_C}\right)}{ZT\varepsilon - \ln\left(\frac{T_H}{T_C}\right)} \quad (4)$$

$$\lambda(\varepsilon, x) = \lambda_C e^{B(\varepsilon)\frac{x}{x_0}} \quad \text{where} \quad B(\varepsilon) = \frac{ZT\varepsilon^2 + \ln^2\left(\frac{T_H}{T_C}\right)}{ZT\varepsilon - \ln\left(\frac{T_H}{T_C}\right)} \quad (5)$$

$$\rho(\varepsilon, x) = \rho_C e^{C(\varepsilon)\frac{x}{x_0}} \quad \text{where} \quad C(\varepsilon) = \frac{\varepsilon + \ln\left(\frac{T_H}{T_C}\right)}{1 - \frac{\ln\left(\frac{T_H}{T_C}\right)}{ZT\varepsilon}} \quad (6)$$

As provided herein, the temperature profile presented in Equation (3) may be used to design and implement the optimum profile within a TE element with constant ZT. Also, Equations (4), (5) and (6) may be used in the thermoelectric element design, for example to select appropriate material properties within the thermoelectric leg that change in the direction of current flow that provide as close to optimal of a solution to these equations, within the constraints of real-world material systems, cost constraints, and the like, as noted elsewhere herein.

FIG. 2 schematically illustrates a notional indication of example (e.g., optimum) Seebeck profiles 208 and 210 as a function of distance from the cold end 204. In some examples, the thermal conductivity and electrical resistivity may have a similar profile form, that is, they increase smoothly in magnitude in a nonlinear fashion toward the hot end 203.

Figure 3:
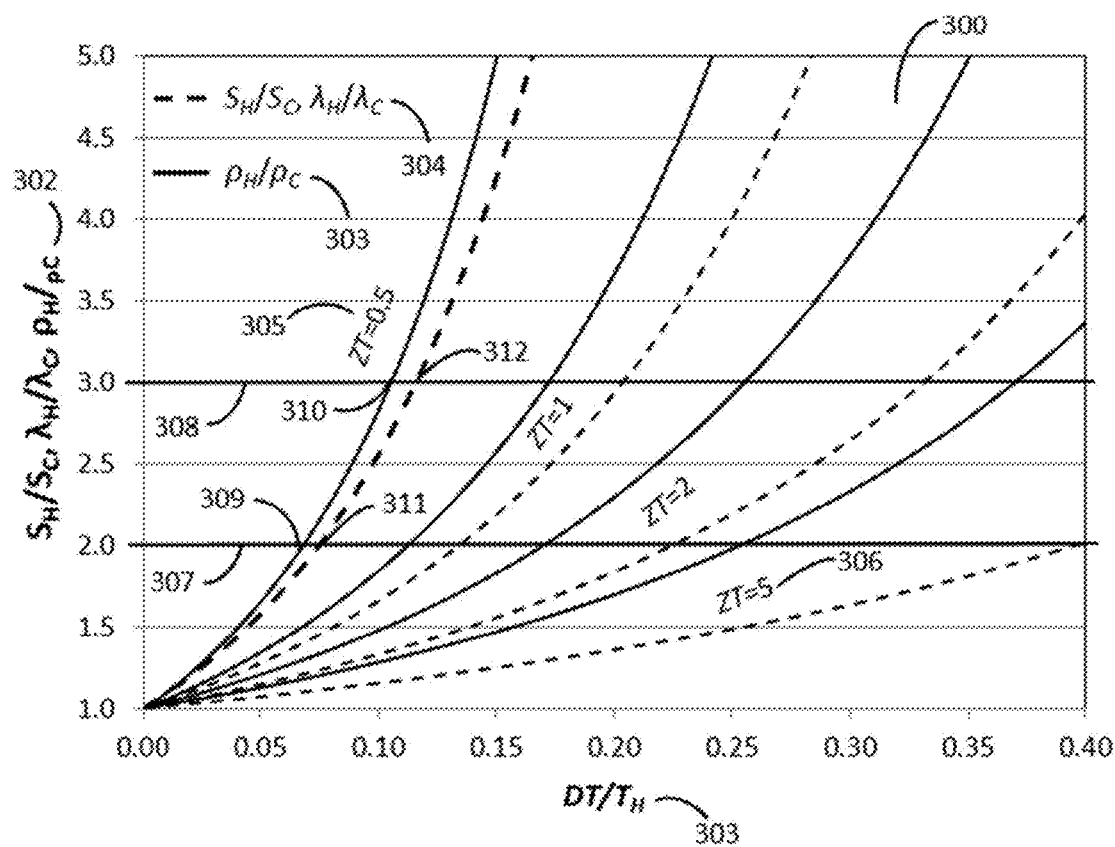
FIG. 3 is a plot of the variation of Seebeck coefficient, thermal conductivity and electrical resistivity in the direction of current flow in example DTP TE elements as a function of $DT/T_H$.

FIG. 3 is a plot of the variation of Seebeck coefficient, thermal conductivity, and electrical resistivity in the direction of current flow in example DTP TE elements as a function of $DT/T_H$. More specifically, FIG. 3 presents a graph 300 of the ratio of transport properties at the hot to cold ends derived from Equations (4), (5) and (6). In FIG. 3, the horizontal axis 303 is $DT/T_H$ the ratio of hot side to cold side temperature differential (DT) to the hot side temperature ($T_H$). The vertical axis 302 are the ratios of each of the hot to cold side for each of the three transport properties. The ratios 304 for Seebeck coefficient and thermal conductivity are the same. The ratio for electrical resistivity 303 is lower. Ratios are presented for several example values of ZT ranging from ZT=0.5 (curve 305) to ZT=5.0 (curve 306). Horizontal line 307 indicates at a ratio of 2.0, and represent the ratios obtainable for some example TE material systems. As an example, horizontal line 307 intercepts ZT curve 305 at a resistivity ratio 303 at point 309. Thus subject to a maximum obtainable resistivity ratio of 2.0, the maximum $DT/T_H$ 303 for which optimum DTP performance can be realized is about 0.07. Similarly, ZT=0.5 305 intercepts horizontal line 308 at point 310, and thus for a realizable resistivity ratio 303 of 3.0, the maximum $DT/T_H$ 303 for which optimum TE performance can be realized is about 0.11. Other limitations result from corresponding realizable transport ratios 304 at points 311 and 312. To fully express the capability of DTP and achieve a hypothetical optimum performance, all three transport properties must follow these relationships. Therefore, in producible (real-world) TE systems, the transport properties of TE designs should approximate the ideal DTP values as closely as production and material considerations, cost, and usage may allow.

Figure 4:
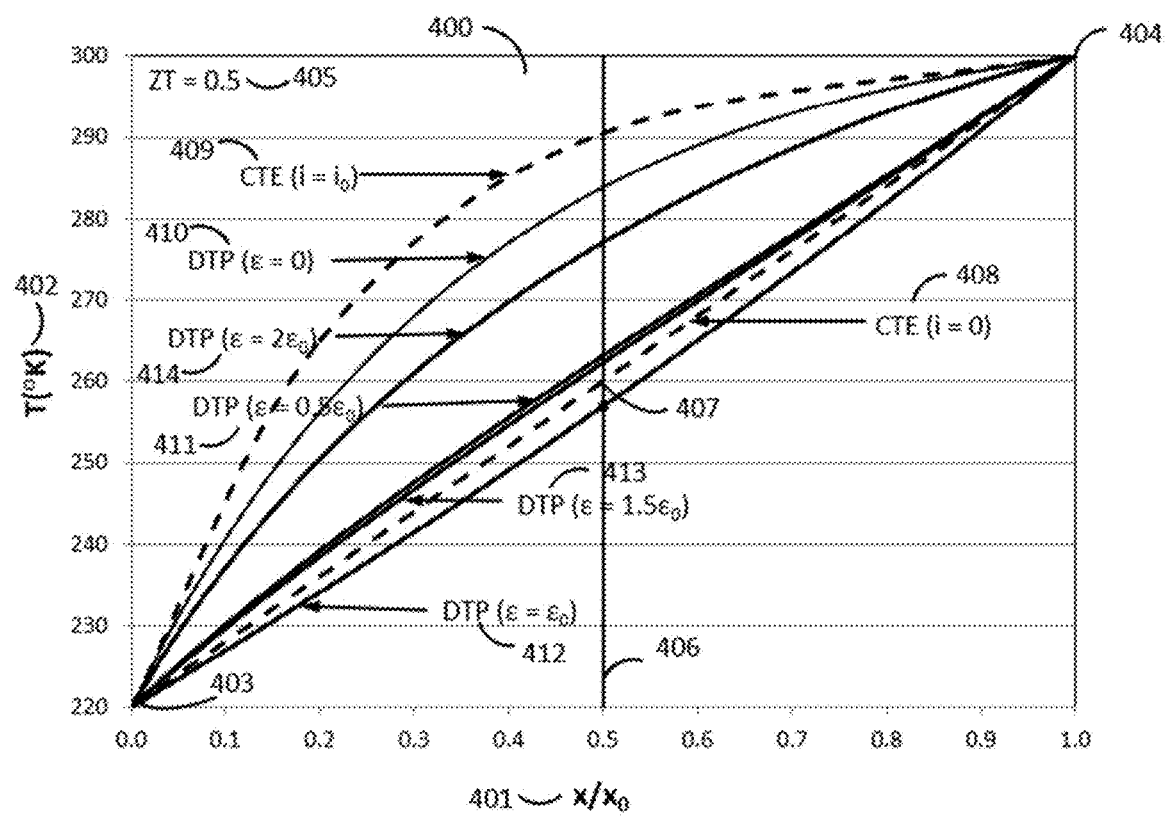
FIG. 4 is a plot of temperature profiles within example CTE and DTP TE elements for a representative variety of operating currents.

The importance of controlling transport properties, and hence producing DTP TE elements in TE couples can be shown by referring to FIG. 4 which shows typical temperature profiles for example couples such as CTE couple 100 of FIG. 1 and DTP TE couple 200 of FIG. 2 at several operating currents. Temperature profile graph 400 has horizontal axis $x/x_0$ 401, the position in the direction of current flow and vertical axis TE element temperature 402. In this example, the TE element cold end temperature 403 is 220 K and the hot end temperature 404 is 300 K. Plots are presented for ZT=0.5 405 with dashed curves 408 and 409 given for temperature profiles at zero current 408 and the current that produces the highest efficiency 409. Similarly, curves 410, 411, 412, 413 and 414 present example DTP TE element temperature profiles for currents ranging from zero (that is, $\varepsilon=0$) to two times the current that produces optimum efficiency ($\varepsilon=2\varepsilon_0$). Vertical line 406 identifies the midpoint along the TE element length 401. For example, point 407 indicates that a CTE TE element temperature at its midpoint is 260 K. The profile at zero current is linear because CTE properties do not change with position or temperature. As current increases, Joule heating adds a parabolic component to the profile. The profile at optimum COP (i.e. when $i=i_0$) 409 indicates the amount the temperature profile is distorted when typical current flows through a TE element. With DTP TE elements, and the assumption that transport properties are temperature independent, (but position dependent), the profile at zero current 410 is not linear because the thermal conductivity of the TE material varies along the element length in a programmed fashion. At small values of the current, $\varepsilon$, the Thompson term dominates, and the temperature profile 411 becomes increasingly less distorted and at optimal operating current $\varepsilon_0$, the temperature profile 412 becomes the ideal file in accordance with Equation (3) and is slightly concave upward. At that condition, the Thompson term and the Joule heating term cancel each other so that the profile is optimum. At greater current 413 and 414 the temperature profile becomes concave downward since Joule heating dominates.

Figure 5:
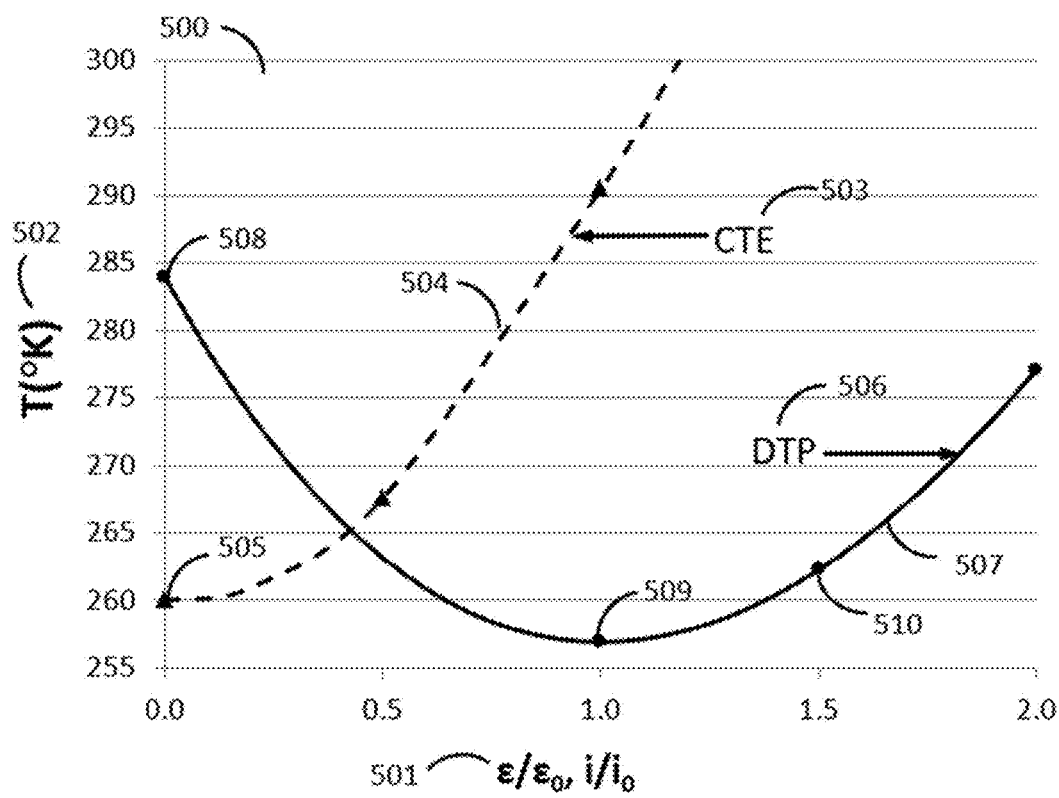
FIG. 5 is a plot depicting the temperature profile at the center point of example CTE and DTP TE elements as a function of position along the element length for different operating currents.

FIG. 5 is a plot depicting TE element midpoint temperature as a function of current. The horizontal axis, 501 is the ratio of both CTE and DTP currents to their respective currents that produce peak efficiency (COP). The vertical axis 502 is the temperatures at the midpoint for both the example CTE and DTP TE elements modeled in FIG. 4, that is, the temperature on line 406 of FIG. 4. Dashed temperature plot 504 presents the midpoint temperature for CTE TE elements (under the conditions associated with FIG. 4). Similarly, solid curve 506 is the plot for a DTP TE element. Points 505 and 508 are temperatures 504 and 507 respectively for the example CTE 503 and DTP 507 TE elements at zero current. As currents 501 increase, CTE midpoint temperature 504 increases due to Joule heating, while DTP midpoint temperature 506 decreases due to the dominance of the Thompson effect over Joule heating, reaching a minimum and the optimum temperature profile at current 501 value of 1.0 509. The DTP profile 506 becomes less distorted from the ideal profile as current increases. Large distortions of DTP profile 506 occur at higher current 501 that with the CTE profile 504, so DTP TE elements can be operated efficiently at higher currents 501. As a result, cooling capacity, which increases with input current, can be higher. Further, the DTP optimum midpoint temperature, 509 is not reached by CTE profile 505, at any current. Thus, efficiency of CTE TE elements will be lower and therefore DTP efficiency will be greater than for CTE systems. While FIGS. 4 and 5 are specific examples, they represent the relative characteristics of CTE and DTP systems more generally, and it can be stated that for ideal CTE and DTP systems, DTP systems will have higher peak efficiency (COP) and will have higher cooling capacity.

The basic transport equations for CTE and the new transport equations for DTP govern the efficiency and cooling capacity of the respective thermoelectric systems they describe. In CTE devices, the cooling capacity as a function of current is:

$$q_{CCTE}(i) = \lambda \left( ZT_C^2 i \left(1 - \frac{i}{2}\right) - \Delta T \right) \quad (7)$$

which leads to a maximum cooling capacity of:

$$q_{CCTE}(i_{MAX}) = \lambda \left( \frac{ZT_C^2}{2} - \Delta T \right). \quad (8)$$

The maximum COP may be expressed as:

$$COP_{CCTE}(i_0) = \frac{T_C}{\Delta T}\left(\frac{M_A - \frac{T_H}{T_C}}{M_A + 1}\right) \quad (9)$$

and COP as a function of current, i, may be expressed as:

$$COP_{CCTE}(i) = \frac{q_{CCTE}(i)}{q_{HCTE}(i) - q_{CCTE}(i)}, \quad (10)$$

in which:

$$q_{HCTE}(i) = \lambda\left(ZT_C T_H i\left(1 + \frac{i}{2}\right) - \Delta T\right). \quad (11)$$

In DTP systems, the newly developed cooling capacity equation as a function of current is:

$$q_{CDTP}(i) = T_C \lambda_C \left[ZTi - \ln\left(\frac{T_H}{T_C}\right)\right]. \quad (12)$$

Note that for DTP, there is no theoretical maximum cooling capacity since the current, ε, is unbounded. However, in attainable designs in the real world, there will be a practical maximum subject to the limitations in the range of Seebeck and the other transport properties that are available with a high ZT as noted in the discussion of FIG. 3.

The COP of the newly developed DTP cooling system does have a peak value:

$$COP_{CDTP}(\varepsilon_0) = \frac{1}{\left(\frac{T_H}{T_C}\right)^{\left(\frac{M+1}{M-1}\right)} - 1}. \quad (13)$$

The COP as a function of current may be expressed as:

$$COP(\varepsilon) = \frac{q_{CDTP}(\varepsilon)}{q_{HDTP}(\varepsilon) - q_{CDTP}(\varepsilon)}, \quad (14)$$

where:

$$q_{HDTP}(\varepsilon) = T_H \lambda_C e^{A(\varepsilon)}\left(ZT\varepsilon - \ln\left(\frac{T_H}{T_C}\right)\right)$$

Figure 6:
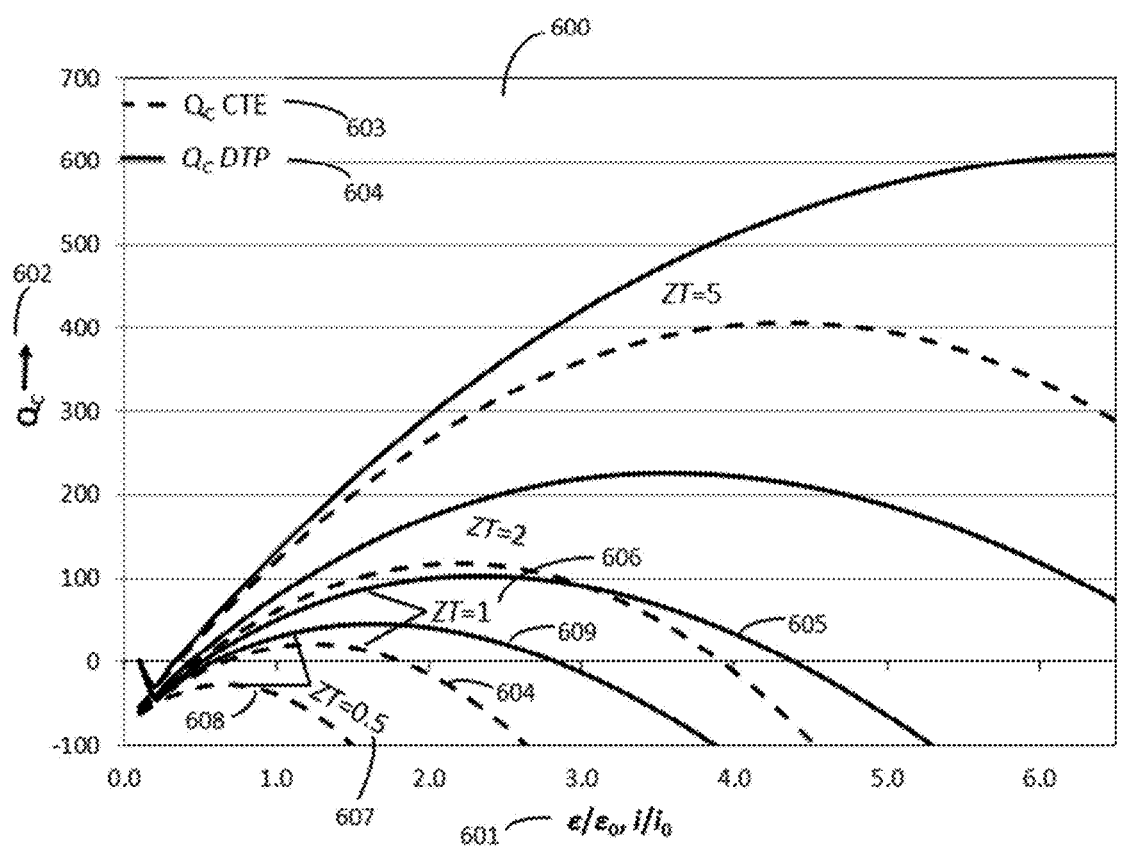
FIG. 6 is a plot depicting example CTE and DTP TE couple cooling capacity as a function of input current for a representative DT and ZTs (figure of merit $ZT=S^2/(\lambda\rho)$).

FIG. 6 presents graph 600 in which the horizontal axis 601 is the ratio of both CTE and DTP currents to their respective currents that produce peak efficiency (COP) and a vertical axis 602 is cooling capacity, $Q_C$ for couples such as example CTE couple 100 of FIG. 1 and example DTP TE couple 200. CTE cooling capacities are curves 603 and DTP cooling capacity curves are 604. Results are shown for several ZTs. The curves are representative of TE systems operating near Max DT. CTE curve 604 shows the cooling capacity 602 for CTE systems as a function of current. Similarly, DTP curve 605 shows cooling capacity for the same DT and ZT values. The computations demonstrate that DTP 605 $Q_C$ values range of operating current 601 are always higher than CTE 604 values. Similarly, for ZT=0.5 607 DTP 609 $Q_C$ values range of operating current 601 are always higher than CTE 608 values. In this particular design case CTE values 608 are always less than zero, meaning that under this condition no cooling power $Q_C$ 602 is produced. In contrast, the corresponding DTP 609 TE device produces positive cooping power $Q_C$ 602. This result demonstrates the higher performance of the DTP system.

Figure 7:
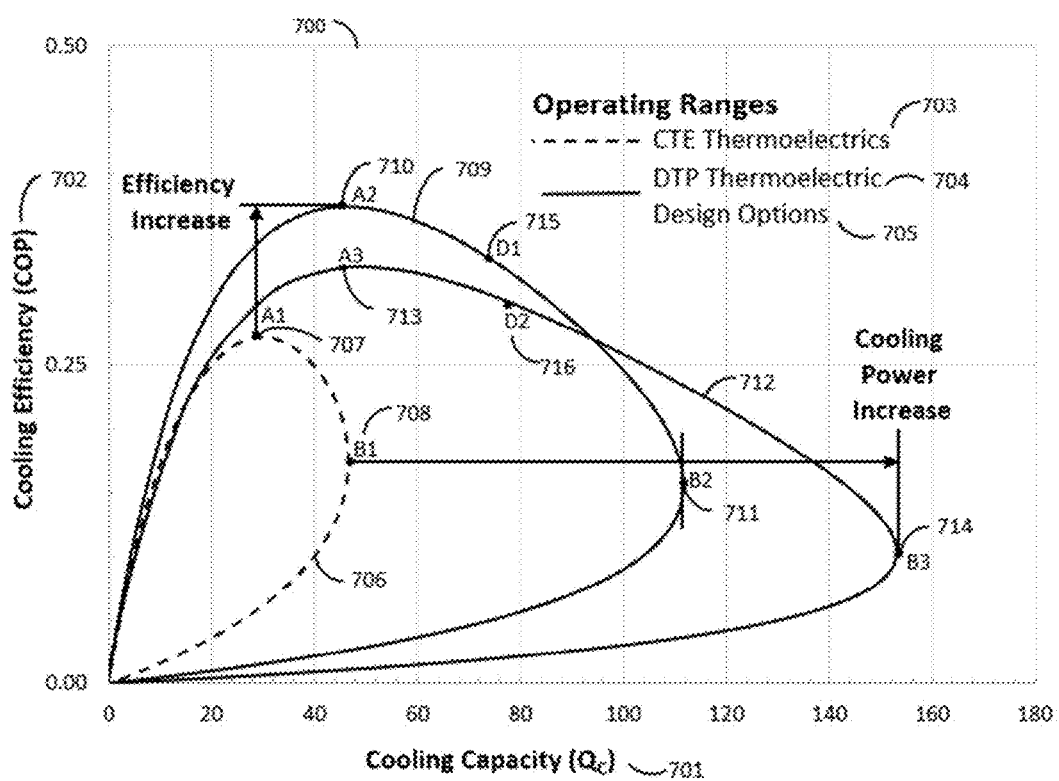
FIG. 7 is a plot depicting the relationship between COP and cooling capacity for example CTE and DTP TE elements in a typical operating condition.

FIG. 7 depicts properties of DTP systems that differ from those of CTE system couples such as CTE couple 100 of FIG. 1 and DTP TE couple 200. The graph represents a particular example of a descriptive operating condition. Horizontal axis 701 is cooling capacity, $Q_C$ and vertical axis 702 is COP. CTE operation range is denoted by curve 703 and DTP operating curves are 704 and 705 denote performance options for DTP TE systems. Curve 706 for CTE systems is a plot of the relationship between COP verses $Q_C$ for all currents for which a positive $Q_C$ is generated. As is evident, curve 706 is a closed loop with peak COP at point A1 707 and peak $Q_C$ at point B1 708. The CTE device operation is anywhere on curve 706. Similarly, loop curve for DTP TE system 709 has peak COP at point A2 710 and peak $Q_C$ at point B2 711. However, unlike CTE curve 706, DTP systems can have transport properties of different functional form with position (but only one such set of transport properties produces optimum COP), and so other performance curves, such as loop curve 712 are producible. In loop curve 712, peak COP point A3 is lower than the corresponding point A2 710 for loop curve 709, and the peak cooling capacity 801 at point B3 714 is greater than peak $Q_C$ (point B2 711) for design loop curve 709. In all, a broad range of loop curves are possible, each with a tradeoff of peak COP 702 and Peak $Q_C$ 701. Loop curve 709 design is preferable to that of loop curve 712 if maximum efficiency is the primary goal and loop curve 712 would be preferred if cooling capacity was most important. Thus, within the property limitations of TE materials, performance of DTP systems can be tailored to best meet the functional requirements of particular cooling applications. The ability to select design relationships between COP and $Q_C$ is a distinct feature of DTP design that is new to the art of TE device design.

Figure 8:
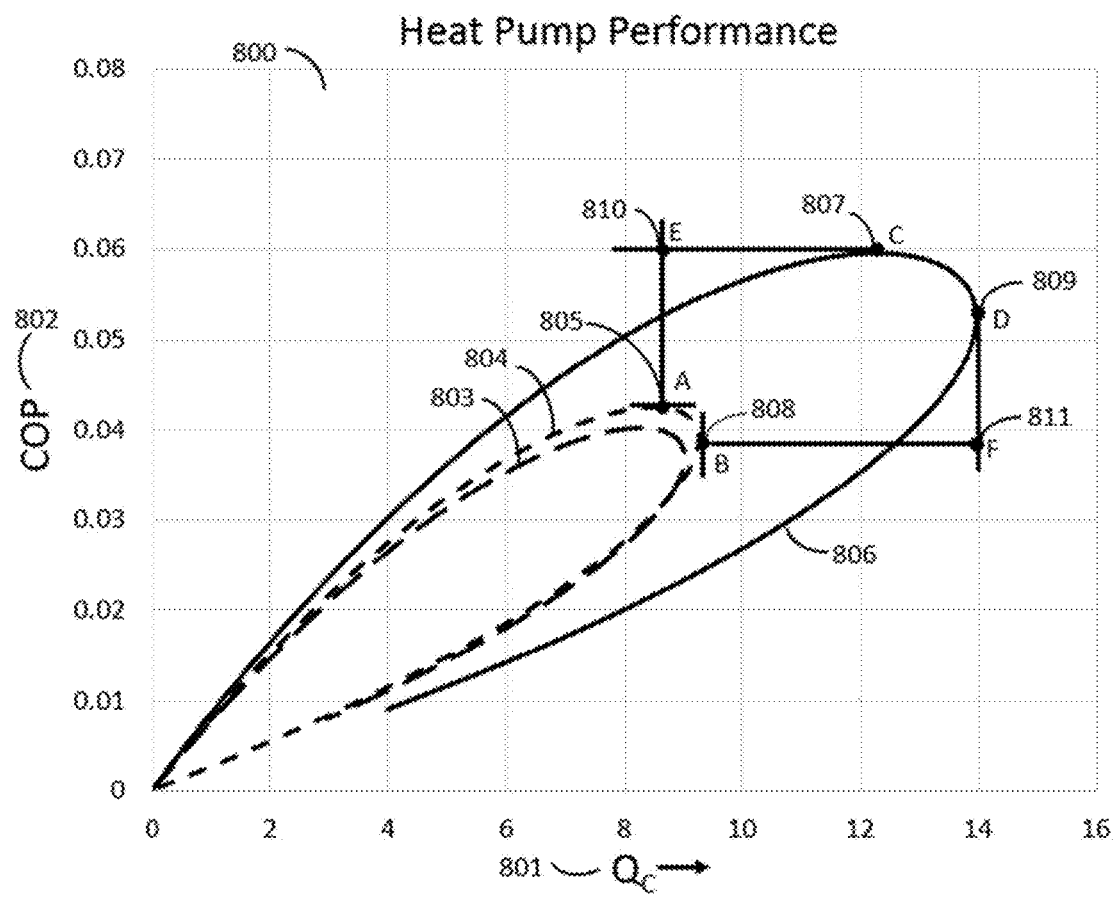
FIG. 8 is a plot comparing the design performance of example commercially available CTE elements and an example DTP TE element designed with commercially available TE materials.

FIG. 8 presents computations that describe the relative performance example high-performing commercially available TE CTE couples including different TE materials than each other, where the p-type leg includes a single homogeneous TE material and the n-type leg includes a different single homogeneous material, with that of an example DTP TE couple designed with the same TE materials which optimize COP by employing DTP design. Graph 800 has horizontal axis cooling capacity, $Q_C$ 801, and vertical axis 802 COP. Loop curve 803 is the computed performance of one of the CTE material systems. Loop curve 804 is a similar curve for the highest performing material. For loop curve 804, point A 805 denotes the highest attainable value of COP 802 and point B 808 the highest $Q_C$ 801. Loop curve 806 shows the properties of the best DTP design operating under the same conditions utilizing best commercially available TE materials. Loop Curve 806 has peak COP 802 at point C 807 and peak $Q_C$ 801 at point D 809. Comparing peak COP 802 from CTE loop curve 804 with DTP loop curve 806, the gain is depicted as point E 810 and the gain for peak $Q_C$ 801 as point F 811. Graph 800 displays the difference in DTP and CTE performance. As an example, for DTP system 806, the maximum COP 802 shown as point C 807 is about 0.060 while the maximum COP 802 of CTE system 804 at point A 805 is about 0.042. Thus, the COP for the DTP system 806 is greater than that of the CTE system 805 as is readily observed as the difference between the COP 802 value at point A 805 and the DTP curve value at point E 810. Similarly, for DTP system 806, the maximum $Q_C$ 801 shown as point D 809 is about 14.0 while the maximum $Q_C$ 801 of CTE system 804 at point B 808 is about 9.4. Thus, the value for $Q_C$ 801 for the DTP system 806 is greater than that of the CTE system 805 as is readily observed as the difference between the $Q_C$ 801 value at point B 805 and the DTP curve value at point F 811.

Figure 9:
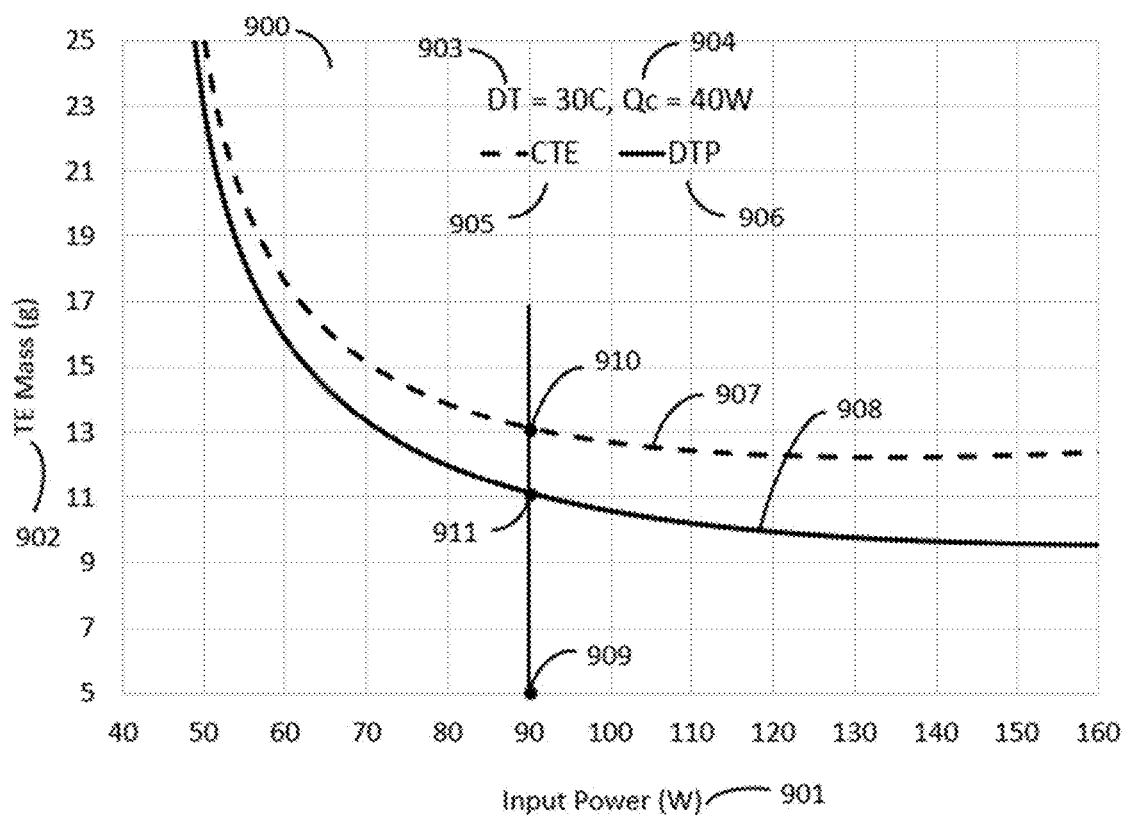
FIG. 9 is a plot comparing material usage of example CTE TE elements versus that of example DTP TE elements operating under the same conditions.

FIG. 9 depicts graph 900 with horizontal axis 901, input power and vertical axis 902, TE mass for DT=30° C. 903, $Q_C$=40 W for both CTE 905 and DTP 906 TE systems. Graph 900 is a specific example of the relative weights of the TE material requirements for the two system designs each operating at the same hot side and cold side temperature, each constructed of commercially available TE materials and each producing the same $Q_C$. Here, the relevant difference is CTE 905 compared to DTP 906. Curve 907 is the weight of TE material required of the CTE system and curve 908 is the weight for the corresponding DTP system. As an example, consider a design power input of 90 Watts point 909, with cooling output $Q_C$=40 W 904. CTE curve 908 requires an amount of TE material indicated by point 910 and similarly, point 911 indicates the amount of DTP material required. Thus, in this particular example about 15% less TE material is required to achieve the same performance with a DTP material as for a CTE material. The material reduction may, for example, result in the need for 15% fewer TE elements of the same size and weight. As such, in addition to the reduced material usage, beneficial reductions in size and weight are provided by the DTP system as compared to that of the CTE system. Other operating conditions would also display a range of material usage for DTP systems, with some showing small reductions and other considerably larger reductions.

The ability to reduce the mass of thermoelectric material utilized for a given thermal power output is a valuable attribute of DTP devices. For example, such a reduction in mass has the benefit to preserve and extend limited resources such as the amount of tellurium contained in conventional bismuth telluride TE material systems and in other TE material systems containing other costly, hard to obtain, or rare materials.

Figure 10:
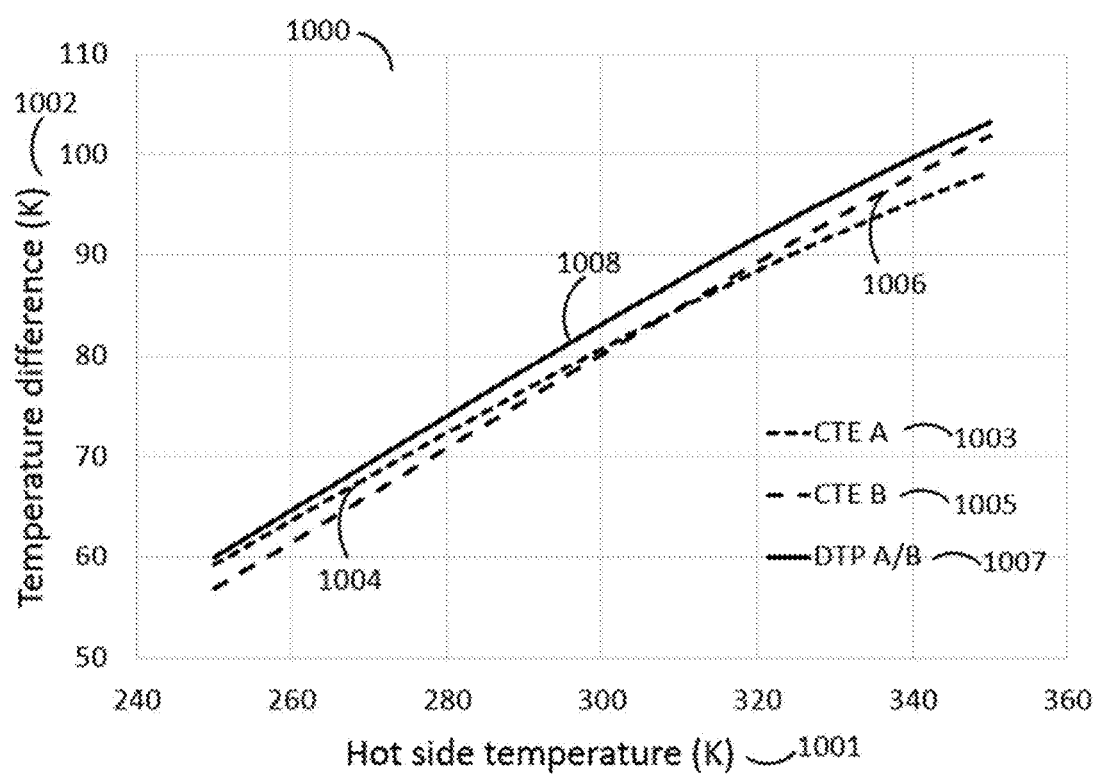
FIG. 10 is a plot comparing the performance of two example CTE TE elements, using respective materials, with the same two materials fabricated into an example DTP TE element.

FIG. 10 is another example of important differences between CTE and DTP TE couples. Graph 1000 has horizontal axis hot side temperature 1001 and vertical axis has maximum temperature difference (Max DT) 1002. In this example, CTE material system A 1003 is the commercial TE material that exhibits the highest Max DT for materials designed to operate with their hot side below room temperature. CTE material B 1005 exhibits the highest Max DT for materials designed to operate at high hot side temperatures curve 1006. Material A/B 1007, designed from materials A 1003 and B 1005 using DTP design principles, produces Max DT curve 1008. In Graph 1000, the conditions are that each of the three system designs operate in the same environment, at the same hot side temperature, are constructed from TE elements of the same height and the TE elements have the same contact resistance at end terminations. Graph 1000 shows that by using the same TE materials in an optimum DTP configuration, Max DT is greater for DTP curve 1008 over the entire operating range. Thus, employing DTP teachings, the same TE materials can produce greater Max DT performance over a broad range of operating conditions.

Figure 11:
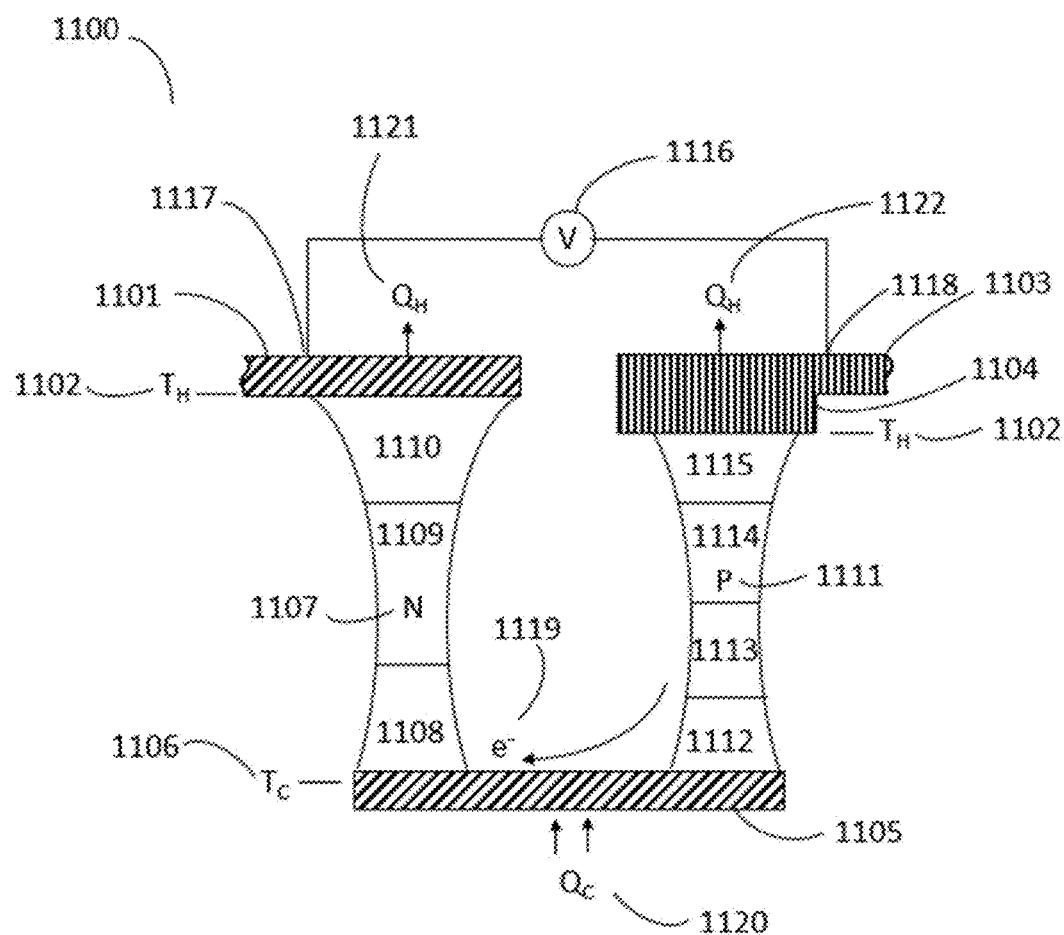
FIG. 11 schematically illustrates an example design option for a DTP TE couple.

To depict some of the freedoms in the design of DTP elements, FIG. 11 is a schematic of a TE couple 1100 including TE elements that vary in cross sectional area in the direction of current flow and the elements include different TE materials. TE couple 1100 has hot side electrodes 1101 and 1103 each at temperature $T_H$ 1102. Electrode 1103 is depicted as being a different thickness than electrode 1102. Cold side electrode 1105 is at temperature $T_C$ 1106. N-type TE element 1107 includes n-type TE material segments 1108, 1109 and 1110. P-type TE element 1111 includes p-type TE material segments 1112, 1113, 1114 and 1115. Electric power source 1116 is connected to hot side electrode 1101 though connection 1117 and to hot side electrode 1103 through connection 1118. In operation, when power is applied so that electrons 1119 flow in the direction shown, cold electrode 1105 absorbs thermal power $Q_C$ 1120 and rejects heat $Q_H$ 1121 and 1122 through hot side electrodes 1101 and 1103. Advantageously, the three n-type TE materials 1108, 1109 and 1110 that comprise n-type TE element 1107, each have Seebeck coefficients, thermal conductivities and electrical resistivities that, in magnitude, are progressively larger toward hot end 1102. Thus, while the TE materials within each individual TE segment, 1108, 1109 and 1110 have traditional TE material properties that do not vary, the entire n-type TE element 1107 functions as a DTP TE element. A similar description holds for p-type TE element 1111.

Simulations demonstrate that sufficient Thompson effect, which is generated at the boundaries where the segments connect, can produce a significant portion of the DTP effect if the transport properties varied continuously. For further details, see the following references authored by the present inventors, the entire contents of each of which references are incorporated by reference herein: Crane and Bell, "Maximum temperature difference in a single-stage thermoelectric device through distributed transport properties," International Journal of Thermal Sciences 154: 106404, pages 1-9 (2020); and Bell, "Optimally distributed transport properties can produce highest performance thermoelectric systems," Phys. Status Solidi A: 1900562, pages 1-7 (2019). As demonstrated, more segments can produce heat pumping performance closer to that of elements with continuously varying transport properties. For example, a TE element including 5 or more segments in general, can have nearly the same performance as that of a TE element fabricated from the same TE material system but with continuously vary transport properties.

Referring to FIG. 10, material system A/B is an example of a segmented DTP TE couple. In that embodiment, the DTP couple is designed using two segments (materials A and B) in each leg of the couple, The resulting Max DT, while greater than that of material A or B alone, could exhibit higher performance if several segments with properties between those of A and B could be used it its design.

Figure 12:
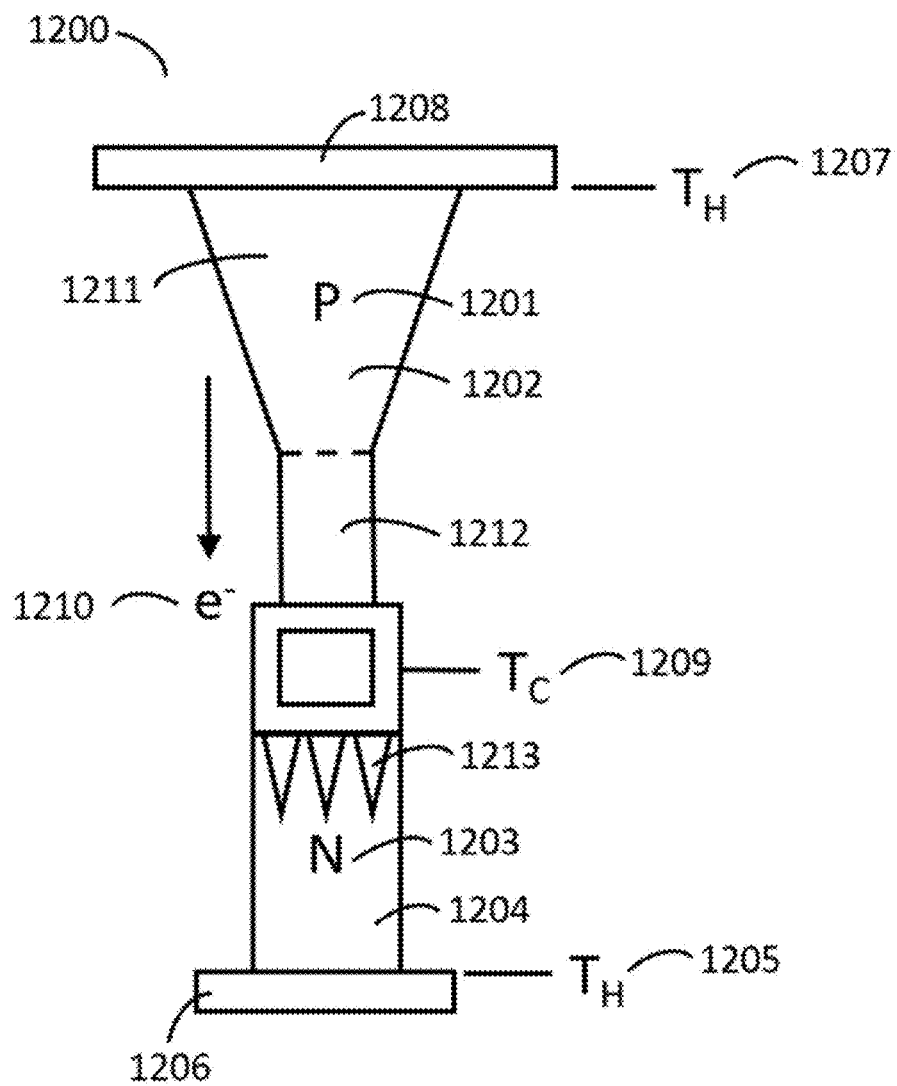
FIG. 12 schematically illustrates an example design option for a DTP TE element in a stack configuration.

FIG. 12 depicts a DTP TE couple arranged in a stack configuration. Stack TE schematic 1200 has a p-type TE element 1201 including segment 1202 and segment 1203. TE element 1201 is in electrical and thermal contact with hot side electrode 1204 at temperature 1205 and on the cold side to electrode 1206 at temperature 1207. Advantageously, the thermal and electrical contacts have interfacial resistances that are less than 2% of the TE element resistances. In some examples, n-type TE element 1208 is a monolithic DTP TE element. TE element 1208 is in good electrical and thermal contact with hot side electrode 1209 at hot side temperature 1210 and on the cold side electrode 1206 at cold side temperature 1207.

For explanatory purposes, and to demonstrate the range of design freedom that can be employs to optimize DTP TE couple design freedom, TE DTP couple 1200 is depicted as having a complex design. P-type TE element 1201 is shown as having a conical shape and is mated to cylindrically shaped segment 1203. More discussion of the effects of area change in the direction of current flow on DTP performance can be found in see the following reference authored by the present inventors, the entire contents of which reference are incorporated by reference herein: Crane and Bell, "Maximum temperature difference in a single-stage thermoelectric device through distributed transport properties," International Journal of Thermal Sciences 154: 106404, pages 1-9 (2020). (As one example, cross sectional area change can be employed to modify the relationship between thermal and electrical resistance to better optimize DTP performance). As noted above, N-type TE element 1208 has DTP structure. At its cold end it has slots 1212 extending downward into the body of n-type TE element 1208 to vary cross sectional area at the cold end.

Advantageously, cold electrode 1206 is fabricated from a material with high electrical and thermal conductance such as copper or silver. The hollow cold side electrode 1206 depicted can provide a temperature controlled environment for samples, electronic circuits, laser systems, sensors, and any other item of appropriate size requiring temperature control.

Stack design 1200 has different mechanical and heat loss performance characteristics than the couple design of FIG. 1. Advantageously, compressive loads are applied to hot electrodes 1204 and 1209 so that the system is under compressive load in operation. Some TE materials, such as Bismuth Telluride are physically weak and can fail under modest tensile or shear load, and therefore benefit from being appropriately loaded in compression. Further, stack design 1200 can better control parasitic losses, including those from thermal conduction and convection, electrical resistances and cold side radiant heating.

Figure 13:
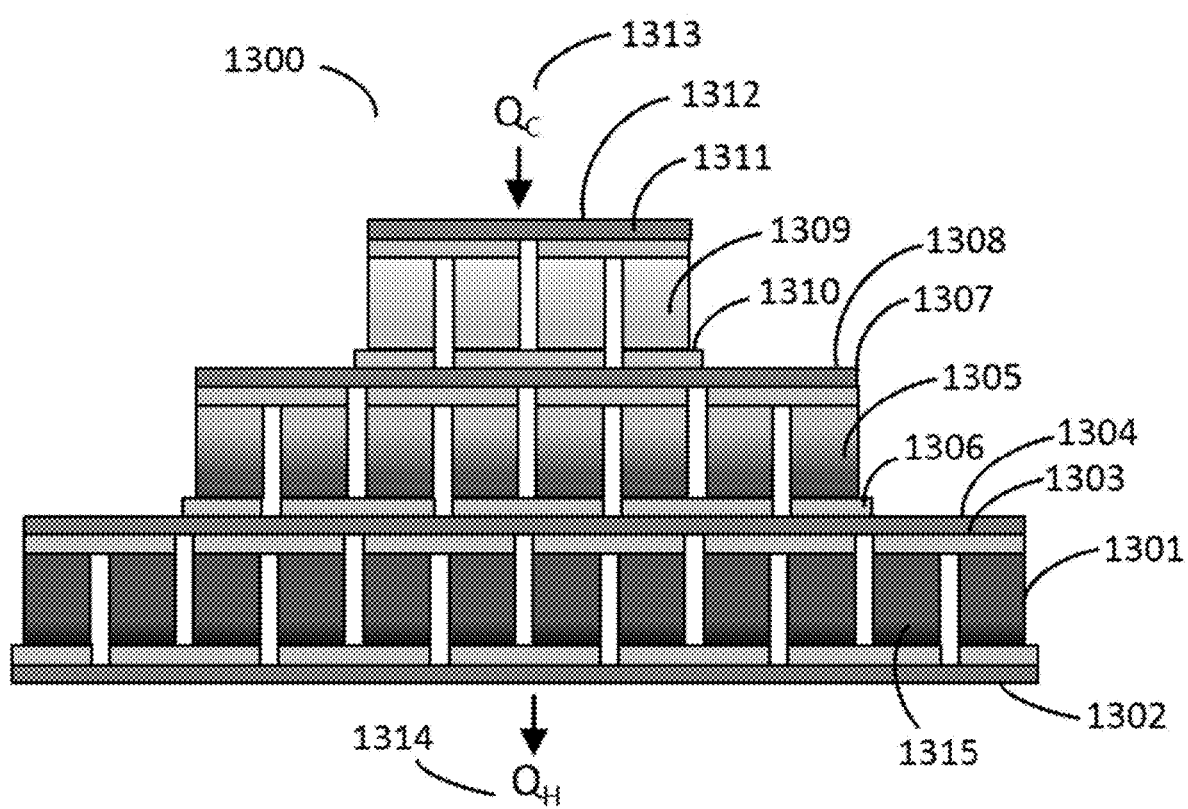
FIG. 13 schematically illustrates an example TE element cascade design.

FIG. 13 depicts a TE cascade 1300, comprising a first TE array 1301, with hot side 1302 and cold side 1303 in good thermal contact with substrate 1304. A second TE array 1305 with hot side 1306 in good thermal contact with substrate 1304. Hot side 1307 of TE array 1305 is in good contact with substrate 1308. Similarly, a third TE array 1309 with hot side 1310 is in good thermal contact with substrate 1308. Cold side 1311 of TE array 1309 is in good contact with cold side substrate 1312. TE arrays 1301, 1305 and 1309 are comprised of n-type and p-type TE couples 1315 connected electrically in series or series parallel arrangements with the hot sides 1302, 1306 and 1310 of the couples on the bottom side of each array and the cold side 1303, 1307 and 1311 at the top of each array. Thus, cooling $Q_C$ 1313 plus electric power input into array 1309, not shown, is rejected by the hot side of array 1309 and absorbed by cold side of array 1305. Similarly, thermal power from the hot side of array 1309 plus electric power input into array 1305, not shown, is rejected at the hot side of array 1305 and absorbed by cold side of array 1301. That thermal power plus the electric power input into array 1301, not shown is rejected to hot side 1302.

TE cascades 1300 are commercially available from several sources. Their primary usage is to produce DTs that are beyond the Max DT of single stage CTE devices or are beyond the cooling capacity of single stage CTE devices at the required DT. Cascades, 1300 are commercially available with up to six arrays. Generally, each additional array may provide a diminishing contribution to DT. Importantly, because of the efficiency limitations of each CTE array, COP is very low for several stage cascades.

Figure 14:
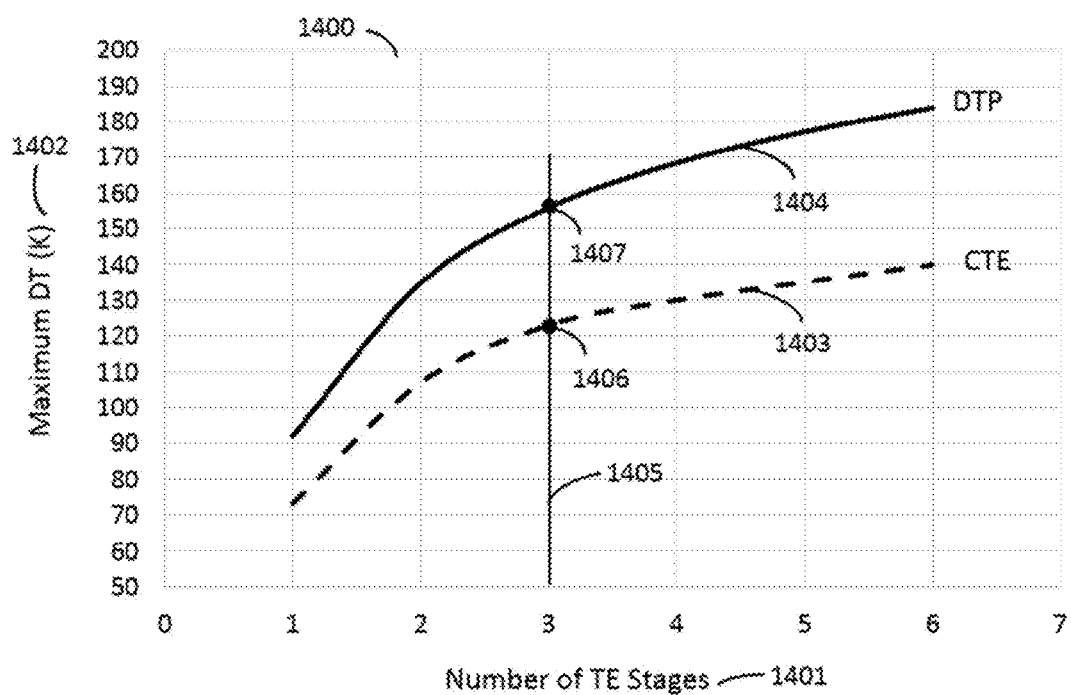
FIG. 14 is a plot comparing example CTE and DTP TE element performance as a function of the number of cascade stages.

Since DTP TE systems can increase TE system efficiency and heat pumping capacity, DTP TE cascade designs exhibit important performance characteristics not available in CTE cascades. FIG. 14 presents a performance comparison between CTE and DTP cascade TE system designs. Graph 1400 has as the horizontal axis TE cascade stages 1401 and vertical axis Max DT 1402. CTE cascade system curve 1403 and DTP curve 1404 are plots of the Max DT attainable with commercially available CTE cascades and DTP cascade designs using present TE materials operating at a hot side of 300 K. As an example, the performance of 3 stage CTE and DTP cascades, vertical line 1405 intersects CTE curve 1403 at point 1406 corresponding to a Max DT of about 122 K. Line 1406 intersects DTP TE curve 1404 at point 1407 corresponding to a Max DT of about 156 K. The 156 K value is not attainable with commercial CTE cascades with up to 6 stages. These design results show the potential compounding benefits from increased COP and $Q_C$ of DTP TE designs in cascade applications.

Figure 15:
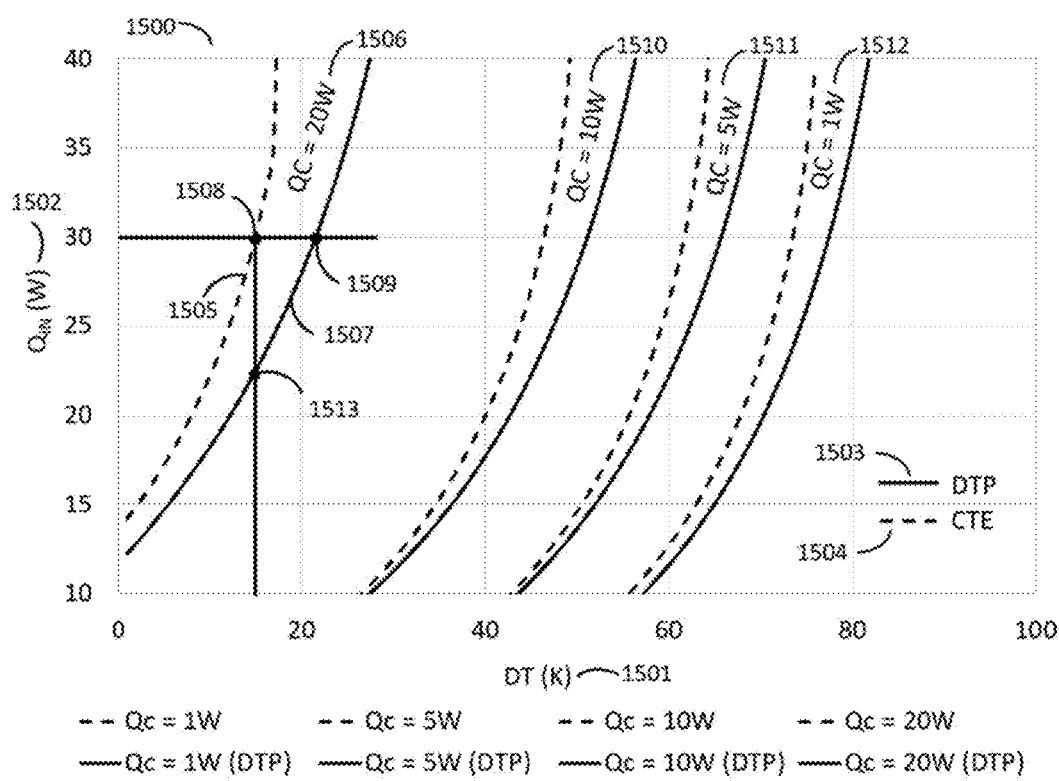
FIG. 15 is a plot comparing example CTE and DTP TE elements in terms of input power and temperature difference for a fixed size and different heat loads.

FIG. 15 depicts graph 1500 with horizontal axis DT 1501 and vertical axis input power $Q_{IN}$ 1502. Solid lines 1503 denote DTP and dashed 1504 denote CTE properties. For a CTE module with fixed TE mass and module physical dimension, dashed curve 1505 presents the relationship between the electrical power input 1502 and the maximum DT 1501 that can produce cooling power output $Q_C$ of 20 w 1506. Similarly, solid DTP curve 1507 presents the relationship between the electrical power input 1502 of a DTP module with the same fixed TE mass and the maximum DT 1501 for which a cooling power output $Q_C$ of 20 w 1506 can be produced. As an example, point 1508 on CTE curve 1505 at 30 W of power input $Q_{IN}$ 1502, will produce $Q_C$=20 W of cooling power 1506 at a Max DT 1501 of about 17 K point 1508. Similarly, point 1509 on DTP curve 1507 has the same input power $Q_{IN}$=30 W 1502 and will produce 20 W of cooling power at a higher Max DT 1501 of about 21 K. Thus, under the same input power and module size constraints, the DTP module can operate at about a 23% greater DT 1501. Similarly, for $Q_C$=10 W 1510, $Q_C$=5 W 1511 and $Q_C$=1 W 1512, DTP modules provide greater Max DT 1501 at all power input levels $Q_{IN}$ 1502. As another example, for a DT 1501 of 17 K and output of $Q_C$=20 W 1506, a CTE module operating at point 1508 of curve 1505 will require a power input $Q_{IN}$ of 30 W while a DTP module of the same size which operates on curve 1507 at point 1513 will require a power input $Q_{IN}$ 1502 of about 22 W. Thus, in this example, the amount of power input $Q_{IN}$ 1502 for use in operation is reduced about 27% for a DTP module as compared to a CTE module.

DTP modules can also operate at a combination of temperature difference, input power and output power $Q_C$ that exceed the capabilities of CTE modules of the same size. For example, a DTP module can operate at point 1509 at DT 1501 of about 22 K, an operating condition for which CTE module, curve 1505, cannot operate at any power level $Q_{IN}$ 1502. These attributes of DTP compared to CTE provide another demonstration of the flexibility to design thermoelectric devices with less input power and thermoelectric material mass, for every temperature difference and heat load.

Compared to CTE elements, which are produced from a single material, the transport properties that change along the direction of current flow of segmented DTP TE elements, may be more favorably manufactured using different processes or processes new to TE element fabrication. Herein, some potentially useful production technologies and methods are described.

In segmented DTP elements made with discrete sections, each section may be metalized on both ends and the segments solder connected to one another. The solder, or solders, can be a conventional solders used within the electronics or other industries or solders tailored to meet the performance requirement of particular DTP TE systems. For example, it may be advantageous to use solders and fluxes formulated to reduce interface thermal and electrical losses at the ends of a TE element to less than 2% of the resistance of the TE element itself, so the interfacial resistances are small compared to the resistance of the TE material portion of an element and do not reduce performance below an acceptable amount. Also, it may be advantageous to use solder systems or TE material surface treatments so that the solder does not wick along the TE leg in the direction of current flow and by controlling wicking, reduce short circuiting from element side wetting to acceptable levels. Also, solders may be used that have mechanical properties that provide stress reduction from thermal coefficient of expansion (CTE) mismatch at segment and TE element end interfaces.

The joining of dissimilar materials, such as a section of an organic TE material adjacent to a section of an inorganic TE material, may benefit from solder connection. Similarly, if CTE mismatch is relatively large, as might be the case in organic/inorganic TE material interfaces, joining of the materials may benefit by connection through low rigidity porous metal interfaces or other conductive material interface systems such as conductive epoxies.

Alternatively, the DTP TE material sections may be fabricated from partially consolidated material powders that are placed in layers to form the DTP segments and spark sinter bonded and consolidated. As another alternative, the TE materials may be coextruded and fabricated into TE elements or systems by current production methods or methods developed for DTP TE device assembly. These processes may produce segmented elements that have reduced or eliminated interfacial resistances. Alternatively, TE segments may be bonded through compression bonding at pressures, time and temperatures that do not degrade the TE material properties. For some material systems it may be beneficial to treat or otherwise prepare the surfaces by adding intermediary materials that enhanced bond quality or by special surface treatments that improve joint properties, reduce interfacial losses or increase mechanical strength and durability.

As another alternative, the TE materials may be fabricated by additive manufacturing (AM), screening, or other printing processes. These processes may be employed to produce DTP TE segmented elements with interfacial resistances that are reduced or eliminated. Further, AM, screening, or printing processing may be used to construct DTP TE elements with thin layers to be consolidated into DTP elements consisting of as few as two segments to more than 5 segments. With these methods, consolidation may be performed without the use of any interfacial solder, adhesive, or other constituents that may add undesirable interfacial resistances.

DTP TE elements with continuously varying properties may be produced using TE material growth from a melt similar to one of the methods used to fabricate CTE elements, but adapted to provide suitable DTP properties by varying the melt constituents in the direction of material growth.

Another method for varying DTP properties within a TE element can be selective doping, in which ion implantation of varying density and depth in used to tailor the Seebeck coefficient, electrical resistivity and or the thermal conductivity of the TE element in the direction of current flow. Implantation may be especially beneficial to reduce interfacial resistances at boundaries of TE segments and at TE element ends. Implantation may also be of benefit to modify the Seebeck coefficient at element ends and interfaces to modify the Thompson effect at such locations and to reduce interfacial losses. Either in combination with ion implantation or separately, the DTP TE element and segments may benefit from thermally induced diffusion of dopants controlled in a manner that produces the change in one or more transport property to produce higher performing DTP TE elements or segments.

Yet another method of varying DTP properties is to subject certain TE materials, such as BiSb based materials to magnetic fields and magnetic field gradients. For example Seebeck coefficient can vary with magnetic field strength at temperature between 50 K and 200 K (Goldsmid, Electronic Refrigeration, 1986, FIG. 4.22). In this embodiment, the TE material itself may not have a compositional change either over the entire length of a DTP TE element or a portion of its length, and the magnetic field gradient may produce transport property variations that may be tailored to produce a DTP TE device.

As provided herein, any combinations of the above processes, material modifications, segment connection methods and connection material systems and environmental exposure may be combined to produce DTP TE elements. See also the following reference authored by the present inventors, the entire contents which reference are incorporated by reference herein: Crane and Bell, "Maximum temperature difference in a single-stage thermoelectric device through distributed transport properties," International Journal of Thermal Sciences 154: 106404, pages 1-9 (2020).

Heating Operation.

In the description of FIGS. 1, 11 and 12 and the usage of TE couples 100, 1100, and 1200 are described in terms of their cooling capability. As an example, thermal power is extracted from cold sides 103 and 105 and heat is rejected from hot side 104. The hot side heat rejection is $Q_H$ 110. In steady state operation, conservation of energy requires that:

$$Q_H = Q_C + Q_{IN}, \qquad (15)$$

where $Q_{IN}$ is the power supplied by electric power input 108 and all other sources of power acting on the TE couple 100. For explanatory purposes in this discussion of heating operation, it is assumed that power supplied by electric power input 108 is the sole source of $Q_{IN}$. Then, dividing Equation (15) by $Q_{IN}$ provides that:

$$COP_H = COP_C + 1, \qquad (16)$$

where $COP_H$ is the heating efficiency and $COP_C$ is the cooling efficiency. $COP_C$ has heretofore been identified as COP. It is important to notice that in steady state operation, since the two differ by a constant, whatever design processes and operating conditions maximize $COP_C$, they also maximize $COP_H$. In steady state, the performance optimizations ascribed to the cooling power of cold sides of the TE couples in FIGS. 1, 11 and 12 apply to hot side heat output $Q_H$110. These performance characteristics are a direct result of Equation (16).

If heating output is a design objective, either in addition to cooling or instead of cooling, the hot side of DTP designs can provide heating efficiency and thermal pumping capacity greater than that of CTE systems. As a result, in steady state operation of DTP designs, thermal power (heat) is utilized from the hot side of a DTP system, the resulting heat pump performance can be superior to the thermal power output of comparable CTE system in the same manner as cooling efficiency and cooling capacity can be superior to that of CTE systems. However, and to further clarify performance capability of DTP TE systems, if in steady state operation, the electron flow shown in FIG. 1 is reversed, so hot side 104 becomes cold (thermal power absorbing) and cold sides 103 and 105 become hot (thermal power rejecting) generally, $COP_H$ for a DTP system will be lower than that of a comparable (reference) CTE system.

The differences in COP and $Q_C$ between CTE and DTP TE couples, modules and devices (parts) are a function of the ratio between DT of the measurement condition and Max DT of the CTE part. The functional relationship is discussed and described in the following references authored by the present inventors: Crane and Bell, "Maximum temperature difference in a single-stage thermoelectric device through distributed transport properties," International Journal of Thermal Sciences 154: 106404, pages 1-9 (2020); and Bell, "Optimally distributed transport properties can produce highest performance thermoelectric systems," Phys. Status Solidi A: 1900562, pages 1-7 (2019). For clarity, when general statements are made herein comparing COP and $Q_C$ between CTE and DTP parts, and no specific temperature differential is noted, the ratio DT/(Max DTcte) is 0.9, where Max DTcte is for the comparable CTE part temperature measurement condition. Further, the measurements are made within the design operating temperature range of the TE part. This definition of the measurement condition holds for claims herein in which COPs and QCs of CTE and DTP systems are contrasted. These conditions hold as well for loop curves 803, 804 and 806 in FIG. 8.

Under one aspect provided herein, a thermoelectric heat pump includes at least one distributed transport properties (DTP) thermoelectric (TE) couple comprising at least one DTP TE element. The at least one DTP TE element includes a DTP TE material with a Seebeck coefficient, thermal conductivity, or electrical resistance varying within said DTP TE element such that when that DTP TE element is subjected to a fixed temperature differential and no current is flowing in a primary direction that produces heat pumping action, at least at one position within that DTP TE element there is a current that in steady state operation produces a lower temperature than the temperature at that position when no current is flowing. Nonlimiting examples of such a thermoelectric heat pump are provided with reference to FIGS. 4 and 5.

In some examples of the thermoelectric heat pump, the steady state current that produces said lower temperature at least at the one position is between 0 current flow and a current flow that produces maximum coefficient of performance (COP). Nonlimiting examples of such a thermoelectric heat pump are provided with reference to FIGS. 4 and 5.

Additionally, or alternatively, in some examples of the thermoelectric heat pump, in the at least one DTP TE element, a change in a composition of the DTP TE material in the primary direction of current flow produces a maximum cooling capacity at least 10% greater than that produced by a reference TE couple of same length in the primary direction of current flow and fabricated using any single n-type and any single p-type TE material contained within the at least one DTP couple. Nonlimiting examples of such a thermoelectric heat pump are provided with reference to FIGS. 6, 7, 8, and 9.

Additionally, or alternatively, in some examples of the thermoelectric heat pump, a change in a composition of the DTP TE material in the primary direction of current flow produces a maximum cooling capacity at least 20% greater than that produced by a reference TE couple of same length in the primary direction of current flow and fabricated using any single n-type and any single p-type TE material contained within the at least one DTP couple. Nonlimiting examples of such a thermoelectric heat pump are provided with reference to FIGS. 6, 7, 8, and 9.

Additionally, or alternatively, in some examples of the thermoelectric heat pump, a change in a composition of the DTP TE material in the primary direction of current flow produces a maximum COP increase at least 2% greater than that produced by a reference TE couple of same length in the primary direction of current flow and fabricated using any single n-type and any single p-type TE material contained within the at least one DTP couple. Nonlimiting examples of such a thermoelectric heat pump are provided with reference to FIGS. 7 and 8.

Additionally, or alternatively, in some examples of the thermoelectric heat pump, a change in a composition of the DTP TE material in the primary direction of current flow produces a maximum COP increase at least 5% greater than that produced by a reference TE couple of same length in the primary direction of current flow and fabricated using any single n-type and any single p-type TE material contained within the at least one DTP couple. Nonlimiting examples of such a thermoelectric heat pump are provided with reference to FIGS. 7 and 8.

Additionally, or alternatively, in some examples of the thermoelectric heat pump, a change in a composition of the DTP TE material in the primary direction of current flow produces a maximum temperature differential increase at least 2% greater than that produced by a reference TE couple of same length in the primary direction of current flow and fabricated using any single n-type and any single p-type TE material contained within the at least one DTP couple. Nonlimiting examples of such a thermoelectric heat pump are provided with reference to FIGS. 10 and 14. As an example, in FIG. 14 for 1 stage 1401, the max DT 1402 is for CTE module performance curve 1403 is about 72K and for the comparable DTP module performance curve 1404 Max DT is about 91K, or about 26% greater.

Additionally, or alternatively, in some examples of the thermoelectric heat pump, a change in a composition of the DTP TE material in the primary direction of current flow produces a maximum temperature differential increase at least 5% greater than that produced by a reference TE couple of same length in the primary direction of current flow and fabricated using any single n-type and any single p-type TE material contained within the at least one DTP couple. Nonlimiting examples of such a thermoelectric heat pump are provided with reference to FIG. 14. As an example, in FIG. 14 for 1 stage 1401, the max DT 1402 is for CTE module performance curve 1403 is about 72K and for the comparable DTP module performance curve 1404 Max DT is about 91K, or about 26% greater.

Additionally, or alternatively, in some examples of the thermoelectric heat pump, under identical heat load conditions and the same temperature difference, input power to the at least one DTE TE element is at least 5% lower than input power for a reference TE couple of same length in the primary direction of current flow and fabricated using any single n-type and any single p-type TE material contained within the at least one DTP couple. Nonlimiting examples of such a thermoelectric heat pump are provided with reference to FIG. 9.

Additionally, or alternatively, in some examples of the thermoelectric heat pump, under identical heat load conditions and the same temperature difference, input power to the at least one DTE TE element is at least 5% lower than for a reference TE couple of same length in the primary direction of current flow and fabricated using any single n-type and any single p-type TE material contained within the at least one DTP couple. Nonlimiting examples of such a thermoelectric heat pump are provided with reference to FIGS. 4 and 5.

Under another aspect provided herein, a thermoelectric couple is provided that includes at least one distributed transport properties (DTP) thermoelectric (TE) element including more than one TE material composition in a primary direction of current flow and configured such that when current flows in that direction and produces a heat pumping effect, a change in the TE material composition in the primary direction of current flow produces a local cooling effect within the at least one DTP TE element that opposes Joule heating in at least a portion of the DTP TE element. Nonlimiting examples of such a thermoelectric couple are provided with reference to FIGS. 4 and 5.

Under yet another aspect provided herein, a thermoelectric couple is provided that includes at least one distributed transport properties (DTP) thermoelectric (TE) element including more than one TE material composition in a primary direction of current flow and configured such that when current flows in that direction an produces a net thermal power output, a change in the TE material composition in the primary direction of current flow produces a local cooling effect within at the DTP TE element that opposes Joule heating in at least a portion of the at least one DTP TE element. Nonlimiting examples of such a thermoelectric couple are provided with reference to FIGS. 4 and 5.

In some examples of either such thermoelectric couple, the change in the TE material composition in the primary direction of current flow produces a maximum cooling capacity at least 5% greater than that produced by a reference TE couple of same length in the primary direction of current flow and fabricated using any single n-type and any single p-type TE material contained within the at least one DTP couple. Nonlimiting examples of such a thermoelectric couple are provided with reference to FIGS. 6, 7, and 8.

Additionally, or alternatively, in some examples of either such thermoelectric couple, the change in the TE material composition in the primary direction of current flow produces a maximum cooling capacity at least 10% greater than that produced by a reference TE couple of same length in the primary direction of current flow and fabricated using any single n-type and any single p-type TE material contained within the at least one DTP couple. Nonlimiting examples of such a thermoelectric couple are provided with reference to FIGS. 6, 7, and 8.

Additionally, or alternatively, in some examples of either such thermoelectric couple, the change in the TE material composition in the primary direction of current flow produces a maximum efficiency increase at least 2% greater than that produced by a reference TE couple of same length in the primary direction of current flow and fabricated using any single n-type and any single p-type TE material contained within the at least one DTP couple. Nonlimiting examples of such a thermoelectric couple are provided with reference to FIGS. 6, 7, and 8.

Additionally, or alternatively, in some examples of either such thermoelectric couple, the change in the TE material composition in the primary direction of current flow produces a maximum efficiency increase at least 5% greater than that produced by a reference TE couple of same length in the primary direction of current flow and fabricated using any single n-type and any single p-type TE material contained within the at least one DTP couple. Nonlimiting examples of such a thermoelectric couple are provided with reference to FIGS. 6, 7, and 8.

Additionally, or alternatively, in some examples of either such thermoelectric couple, the change in the TE material composition in the primary direction of current flow produces a maximum temperature differential increase at least 2% greater than that produced by a reference TE couple of same length in the primary direction of current flow and fabricated using any single n-type and any single p-type TE material contained within the at least one DTP couple. Nonlimiting examples of such a thermoelectric couple are provided with reference to FIGS. 10 and 14. As an example, in FIG. 14 for 1 stage 1401, the max DT 1402 is for CTE module performance curve 1403 is about 72K and for the comparable DTP module performance curve 1404 Max DT is about 91K, or about 26% greater.

Additionally, or alternatively, in some examples of either such thermoelectric couple, the change in the TE material composition in the primary direction of current flow produces a maximum temperature differential increase at least 5% greater than that produced by a reference TE couple of same length in the primary direction of current flow and fabricated using any single n-type and any single p-type TE material contained within the at least one DTP couple. Nonlimiting examples of such a thermoelectric couple are provided with reference to FIG. 14. As an example, in FIG. 14 for 1 stage 1401 the max DT 1402 is for CTE module performance curve 1403 is about 72K and for the comparable DTP module performance curve 1404 Max DT is about 91K, or about 26% greater.

Additionally, or alternatively, in some examples of either such thermoelectric couple, under identical heat load conditions and the same temperature difference, input power to the at least one DTP TE element is at least 10% lower than for a reference TE couple of same length in the primary direction of current flow and fabricated using any single n-type and any single p-type TE material contained within the at least one DTP couple. Nonlimiting examples of such a thermoelectric couple are provided with reference to FIG. 9.

It is to be understood that any respective features/examples of each of the aspects and embodiments of the disclosure may be implemented together in any appropriate combination, and that any features/examples from any one or more of these aspects may be implemented together to achieve the benefits as described herein.

All of the references described above are hereby incorporated by reference herein in their entireties.

While various illustrative examples are described above, it will be apparent to one skilled in the art that various changes and modifications may be made therein without departing from the invention. The appended claims are intended to cover all such changes and modifications that fall within the true spirit and scope of the invention.

What is claimed is:

1. A thermoelectric heat pump, comprising:
   at least one distributed transport properties (DTP) thermoelectric (TE) couple comprising at least one DTP TE element having a first end and a second end,
   wherein the at least one DTP TE element comprises a DTP TE material within which, when no current is flowing, at least two of:
   (i) a Seebeck coefficient $S(x)$ generally increases from the first end to the second end as a function of x,
   (ii) a thermal conductivity $\lambda(x)$ generally increases from the first end to the second end as a function of x, and
   (iii) an electrical resistance $\rho(x)$ generally increases from the first end to the second end as a function of x,
   such that when that DTP TE element is subjected to a fixed temperature differential and no current is flowing in a primary direction that produces heat pumping action, at least at one position within that DTP TE element there is a current that in steady state operation produces a lower temperature than the temperature at that position when no current is flowing.

2. The thermoelectric heat pump of claim 1, in which the steady state current that produces said lower temperature at least at the one position is between 0 current flow and a current flow that produces maximum coefficient of performance (COP).

3. A thermoelectric couple, comprising:
   at least one distributed transport properties (DTP) thermoelectric (TE) element having a first end and a second end, comprising more than one TE material composition in a primary direction x of current flow that produces a heat pumping effect, and within which, when no current is flowing, at least two of:
   (i) a Seebeck coefficient $S(x)$ generally increases from the first end to the second end as a function of x,
   (ii) a thermal conductivity $\lambda(x)$ generally increases from the first end to the second end as a function of x, and
   (iii) an electrical resistance $\rho(x)$ generally increases from the first end to the second end as a function of x,
   such that when current flows in that direction and produces the heat pumping effect, a change in the TE material composition in the primary direction x of current flow produces a local cooling effect within the DTP TE element that opposes Joule heating in at least a portion of the DTP TE element.

4. A thermoelectric couple, comprising:
   at least one distributed transport properties (DTP) thermoelectric (TE) element having a first end and a second end, comprising more than one TE material composition in a primary direction x of current flow that produces a net thermal output, and within which, when no current is flowing, at least two of:
   (i) a Seebeck coefficient $S(x)$ generally increases from the first end to the second end as a function of x,
   (ii) a thermal conductivity $\lambda(x)$ generally increases from the first end to the second end as a function of x, and
   (iii) an electrical resistance $\rho(x)$ generally increases from the first end to the second end as a function of x,
   such that when current flows in that primary direction and produces the net thermal power output, a change in the TE material composition in the primary direction x of current flow produces a local cooling effect within the DTP TE element that opposes Joule heating in at least a portion of the DTP TE element.

5. The thermoelectric couple of claim 3, in which the change in the TE material composition in the primary direction of current flow produces a maximum cooling capacity at least 10% greater than that produced by a reference TE couple of same length in the primary direction of current flow and fabricated using any single n-type and any single p-type TE material contained within the at least one DTP couple.

6. The thermoelectric couple of claim 3, in which the change in the TE material composition in the primary direction of current flow produces a maximum cooling capacity at least 20% greater than that produced by a reference TE couple of same length in the primary direction of current flow and fabricated using any single n-type and any single p-type TE material contained within the at least one DTP couple.

7. The thermoelectric couple of claim 3, in which the change in the TE material composition in the primary direction of current flow produces a maximum efficiency increase at least 2% greater than that produced by a reference TE couple of same length in the primary direction of current flow and fabricated using any single n-type and any single p-type TE material contained within the at least one DTP couple.

8. The thermoelectric couple of claim 3, in which the change in the TE material composition in the primary direction of current flow produces a maximum efficiency increase at least 5% greater than that produced by a reference TE couple of same length in the primary direction of current flow and fabricated using any single n-type and any single p-type TE material contained within the at least one DTP couple.

9. The thermoelectric couple of claim 3, in which the change in the TE material composition in the primary direction of current flow produces a maximum temperature differential increase at least 2% greater than that produced by a reference TE couple of same length in the primary direction of current flow and fabricated using any single n-type and any single p-type TE material contained within the at least one DTP couple.

10. The thermoelectric couple of claim 3, in which the change in the TE material composition in the primary direction of current flow produces a maximum temperature differential increase at least 5% greater than that produced by a reference TE couple of same length in the primary direction of current flow and fabricated using any single n-type and any single p-type TE material contained within the at least one DTP couple.

11. The thermoelectric couple of claim 3, where under identical heat load conditions and the same temperature difference, input power to the DTP TE couple is at least 10% lower than for a reference TE element fabricated of any single TE material contained within the at least one DTP TE element and of same length in the primary direction of current flow.

12. The thermoelectric heat pump of claim 1, in which a change in the TE material composition in the primary direction of current flow produces a maximum cooling capacity at least 10% greater than that produced by a reference TE couple of same length in the primary direction of current flow and fabricated using any single n-type and any single p-type TE material contained within the at least one DTP couple.

13. The thermoelectric heat pump of claim 1, in which a change in the TE material composition in the primary direction of current flow produces a maximum cooling capacity at least 20% greater than that produced by a reference TE couple of same length in the primary direction of current flow and fabricated using any single n-type and any single p-type TE material contained within the at least one DTP couple.

14. The thermoelectric heat pump of claim 1, in which a change in the TE material composition in the primary direction of current flow produces a maximum efficiency increase at least 2% greater than that produced by a reference TE couple of same length in the primary direction of current flow and fabricated using any single n-type and any single p-type TE material contained within the at least one DTP couple.

15. The thermoelectric heat pump of claim 1, in which a change in the TE material composition in the primary direction of current flow produces a maximum efficiency increase at least 5% greater than that produced by a reference TE couple of same length in the primary direction of current flow and fabricated using any single n-type and any single p-type TE material contained within the at least one DTP couple.

16. The thermoelectric heat pump of claim 1, in which a change in the TE material composition in the primary direction of current flow produces a maximum temperature differential increase at least 2% greater than that produced by a reference TE couple of same length in the primary direction of current flow and fabricated using any single n-type and any single p-type TE material contained within the at least one DTP couple.

17. The thermoelectric heat pump of claim 1, in which a change in the TE material composition in the primary direction of current flow produces a maximum temperature differential increase at least 5% greater than that produced by a reference TE couple of same length in the primary direction of current flow and fabricated using any single n-type and any single p-type TE material contained within the at least one DTP couple.

18. The thermoelectric heat pump of claim 1, where under identical heat load conditions and the same temperature difference, input power to the at least one DTP TE element is at least 10% lower than for a reference TE couple of same length in the primary direction of current flow and fabricated using any single n-type and any single p-type TE material contained within the at least one DTP couple.

19. The thermoelectric couple of claim 4, in which the change in the TE material composition in the primary direction of current flow produces a maximum cooling capacity at least 10% greater than that produced by a reference TE couple of same length in the primary direction of current flow and fabricated using any single n-type and any single p-type TE material contained within the at least one DTP couple.

20. The thermoelectric couple of claim 4, in which the change in the TE material composition in the primary direction of current flow produces a maximum cooling capacity at least 20% greater than that produced by a reference TE couple of same length in the primary direction of current flow and fabricated using any single n-type and any single p-type TE material contained within the at least one DTP couple.

21. The thermoelectric couple of claim 4, in which the change in the TE material composition in the primary direction of current flow produces a maximum efficiency increase at least 2% greater than that produced by a reference TE couple of same length in the primary direction of current flow and fabricated using any single n-type and any single p-type TE material contained within the at least one DTP couple.

22. The thermoelectric couple of claim 4, in which the change in the TE material composition in the primary direction of current flow produces a maximum efficiency increase at least 5% greater than that produced by a reference TE couple of same length in the primary direction of current flow and fabricated using any single n-type and any single p-type TE material contained within the at least one DTP couple.

23. The thermoelectric couple of claim 4, in which the change in the TE material composition in the primary direction of current flow produces a maximum temperature differential increase at least 2% greater than that produced by a reference TE couple of same length in the primary direction of current flow and fabricated using any single n-type and any single p-type TE material contained within the at least one DTP couple.

24. The thermoelectric couple of claim 4, in which the change in the TE material composition in the primary direction of current flow produces a maximum temperature differential increase at least 5% greater than that produced by a reference TE couple of same length in the primary direction of current flow and fabricated using any single n-type and any single p-type TE material contained within the at least one DTP couple.

25. The thermoelectric couple of claim 4, where under identical heat load conditions and the same temperature difference, input power to the DTP TE couple is at least 10% lower than for a reference TE element fabricated of any single TE material contained within the at least one DTP TE element and of same length in the primary direction of current flow.

26. The thermoelectric heat pump of claim 1, in which all three of $S(x)$, $\lambda(x)$, and $\rho(x)$ generally increase from the first end to the second end.

27. The thermoelectric heat pump of claim 1, wherein the Seebeck coefficient also is a function of dimensionless current $\varepsilon$, and wherein the DTP TE material is configured such that $S$ is approximately equal to:

$$S(\varepsilon, x) = S_C e^{A(\varepsilon)\frac{x}{x_0}} \text{ where } A(\varepsilon) = \frac{ZT\varepsilon^2 + \ln^2\left(\frac{T_H}{T_C}\right)}{ZT\varepsilon - \ln\left(\frac{T_H}{T_C}\right)},$$

wherein $T_C$ is temperature at the first end ($x=0$), $T_H$ is temperature at the second end ($x=x_0$), $S_C$ is the Seebeck coefficient at the first end, and $ZT$ is a thermoelectric figure of merit and is constant.

28. The thermoelectric heat pump of claim 1, wherein the thermal conductivity also is a function of dimensionless current $\varepsilon$, and wherein the DTP TE material is configured such that $\lambda$ is approximately equal to:

$$\lambda(\varepsilon, x) = \lambda_C e^{B(\varepsilon)\frac{x}{x_0}} \text{ where } B(\varepsilon) = \frac{ZT\varepsilon^2 + \ln^2\left(\frac{T_H}{T_C}\right)}{ZT\varepsilon - \ln\left(\frac{T_H}{T_C}\right)},$$

wherein $T_C$ is temperature at the first end (x=0), $T_H$ is temperature at the second end (x=$x_0$), $\lambda_C$ is the thermal conductivity at the first end, and ZT is a thermoelectric figure of merit and is constant.

29. The thermoelectric heat pump of claim 1, wherein the electrical resistivity also is a function of dimensionless current ε, and wherein the DTP TE material is configured such that ρ is approximately equal to:

$$\rho(\varepsilon, x) = \rho_C e^{C(\varepsilon)\frac{x}{x_0}} \text{ where } C(\varepsilon) = \frac{\varepsilon + \ln\left(\frac{T_H}{T_C}\right)}{1 - \frac{\ln\left(\frac{T_H}{T_C}\right)}{ZT\varepsilon}},$$

wherein $T_C$ is temperature at the first end (x=0), $T_H$ is temperature at the second end (x=$x_0$), $\rho_C$ is the electrical conductivity at the first end, and ZT is a thermoelectric figure of merit and is constant.

30. The thermoelectric couple of claim 3, in which all three of S(x), λ(x), and ρ(x) generally increase from the first end to the second end.

31. The thermoelectric couple of claim 3, wherein the Seebeck coefficient also is a function of dimensionless current ε, and wherein the DTP TE material is configured such that S is approximately equal to:

$$S(\varepsilon, x) = S_C e^{A(\varepsilon)\frac{x}{x_0}} \text{ where } A(\varepsilon) = \frac{ZT\varepsilon^2 + \ln^2\left(\frac{T_H}{T_C}\right)}{ZT\varepsilon - \ln\left(\frac{T_H}{T_C}\right)},$$

wherein $T_C$ is temperature at the first end (x=0), $T_H$ is temperature at the second end (x=$x_0$), $S_C$ is the Seebeck coefficient at the first end, and ZT is a thermoelectric figure of merit and is constant.

32. The thermoelectric couple of claim 3, wherein the thermal conductivity also is a function of dimensionless current ε, and wherein the DTP TE material is configured such that λ is approximately equal to:

$$\lambda(\varepsilon, x) = \lambda_C e^{B(\varepsilon)\frac{x}{x_0}} \text{ where } B(\varepsilon) = \frac{ZT\varepsilon^2 + \ln^2\left(\frac{T_H}{T_C}\right)}{ZT\varepsilon - \ln\left(\frac{T_H}{T_C}\right)},$$

wherein $T_C$ is temperature at the first end (x=0), $T_H$ is temperature at the second end (x=$x_0$), $\lambda_C$ is the thermal conductivity at the first end, and ZT is a thermoelectric figure of merit and is constant.

33. The thermoelectric couple of claim 3, wherein the electrical resistivity also is a function of dimensionless current ε, and wherein the DTP TE material is configured such that ρ is approximately equal to:

$$\rho(\varepsilon, x) = \rho_C e^{C(\varepsilon)\frac{x}{x_0}} \text{ where } C(\varepsilon) = \frac{\varepsilon + \ln\left(\frac{T_H}{T_C}\right)}{1 - \frac{\ln\left(\frac{T_H}{T_C}\right)}{ZT\varepsilon}},$$

wherein $T_C$ is temperature at the first end (x=0), $T_H$ is temperature at the second end (x=$x_0$), $\rho_C$ is the electrical conductivity at the first end, and ZT is a thermoelectric figure of merit and is constant.

34. The thermoelectric couple of claim 4, in which all three of S(x), λ(x), and ρ(x) generally increase from the first end to the second end.

35. The thermoelectric couple of claim 4, wherein the Seebeck coefficient also is a function of dimensionless current ε, and wherein the DTP TE material is configured such that S is approximately equal to:

$$S(\varepsilon, x) = S_C e^{A(\varepsilon)\frac{x}{x_0}} \text{ where } A(\varepsilon) = \frac{ZT\varepsilon^2 + \ln^2\left(\frac{T_H}{T_C}\right)}{ZT\varepsilon - \ln\left(\frac{T_H}{T_C}\right)},$$

wherein $T_C$ is temperature at the first end (x=0), $T_H$ is temperature at the second end (x=$x_0$), $S_C$ is the Seebeck coefficient at the first end, and ZT is a thermoelectric figure of merit and is constant.

36. The thermoelectric couple of claim 4, wherein the thermal conductivity also is a function of dimensionless current ε, and wherein the DTP TE material is configured such that λ is approximately equal to:

$$\lambda(\varepsilon, x) = \lambda_C e^{B(\varepsilon)\frac{x}{x_0}} \text{ where } B(\varepsilon) = \frac{ZT\varepsilon^2 + \ln^2\left(\frac{T_H}{T_C}\right)}{ZT\varepsilon - \ln\left(\frac{T_H}{T_C}\right)},$$

wherein $T_C$ is temperature at the first end (x=0), $T_H$ is temperature at the second end (x=$x_0$), $\lambda_C$ is the thermal conductivity at the first end, and ZT is a thermoelectric figure of merit and is constant.

37. The thermoelectric couple of claim 4, wherein the electrical resistivity also is a function of dimensionless current ε, and wherein the DTP TE material is configured such that ρ is approximately equal to:

$$\rho(\varepsilon, x) = \rho_C e^{C(\varepsilon)\frac{x}{x_0}} \text{ where } C(\varepsilon) = \frac{\varepsilon + \ln\left(\frac{T_H}{T_C}\right)}{1 - \frac{\ln\left(\frac{T_H}{T_C}\right)}{ZT\varepsilon}},$$

wherein $T_C$ is temperature at the first end (x=0), $T_H$ is temperature at the second end (x=$x_0$), $\rho_C$ is the electrical conductivity at the first end, and ZT is a thermoelectric figure of merit and is constant.

\* \* \* \* \*